(12) United States Patent
Banno et al.

(10) Patent No.: US 10,693,467 B2
(45) Date of Patent: Jun. 23, 2020

(54) SWITCH CIRCUIT, SEMICONDUCTOR DEVICE USING SAME, AND SWITCHING METHOD

(71) Applicant: NEC Corporation, Minato-ku, Tokyo (JP)

(72) Inventors: Naoki Banno, Tokyo (JP); Munehiro Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/495,885

(22) PCT Filed: Apr. 5, 2018

(86) PCT No.: PCT/JP2018/014567
§ 371 (c)(1),
(2) Date: Sep. 20, 2019

(87) PCT Pub. No.: WO2018/190241
PCT Pub. Date: Oct. 18, 2018

(65) Prior Publication Data
US 2020/0106443 A1    Apr. 2, 2020

(30) Foreign Application Priority Data
Apr. 11, 2017    (JP) .................. 2017-078050

(51) Int. Cl.
*H03K 19/17*    (2006.01)
*H03K 19/17756*    (2020.01)
(Continued)

(52) U.S. Cl.
CPC ... *H03K 19/17756* (2013.01); *H01L 27/2409* (2013.01); *H01L 45/08* (2013.01);
(Continued)

(58) Field of Classification Search
None
See application file for complete search history.

(56) References Cited

U.S. PATENT DOCUMENTS

| 2015/0340606 A1 | 11/2015 | Tada et al. |
| 2018/0061890 A1 | 3/2018 | Tada et al. |

(Continued)

FOREIGN PATENT DOCUMENTS

| JP | 2002-536840 A | 10/2002 |
| WO | 2010/079816 A1 | 7/2010 |

(Continued)

OTHER PUBLICATIONS

Tada et al., "Improved ON-State Reliability of Atom Switch Using Alloy Electrodes," IEEE Transactions on Electron Devices, vol. 60, No. 10, pp. 3534 to 3540, Oct. 2013, 7 pages total.

(Continued)

*Primary Examiner* — Lincoln D Donovan
*Assistant Examiner* — Khareem E Almo

(57) ABSTRACT

A switch circuit includes: a plurality of four-terminal switches having variable-resistance elements and a rectifier element serially connected; an input line and an output line, at least one of which is multiply present, to which are connected terminals of two switches other than terminals at which the variable-resistance terminals are serially connected; and a control line to which are connected the terminals of the two switches other than the terminals at which the rectifier elements are serially connected, the control line, together with the input line and the output line, turning on and off in turn, by pair, the pair of variable-resistance elements connected to the input line and the pair of variable-resistance elements connected to the output line, among the variable-resistance elements of the plurality of (Continued)

four-terminal switches of the four-terminal switches connected to the input line or the output line.

18 Claims, 24 Drawing Sheets

(51) Int. Cl.
    *H03K 19/17728*    (2020.01)
    *H01L 45/00*    (2006.01)
    *H03K 19/185*    (2006.01)
    *H01L 27/24*    (2006.01)

(52) U.S. Cl.
    CPC ...... *H01L 45/1233* (2013.01); *H01L 45/1683* (2013.01); *H03K 19/17728* (2013.01); *H03K 19/185* (2013.01)

(56) References Cited

U.S. PATENT DOCUMENTS

| | | | |
|---|---|---|---|
| 2019/0140687 A1* | 5/2019 | Tombak | H04B 1/48 |
| 2019/0140688 A1* | 5/2019 | Tombak | H02H 9/046 |

FOREIGN PATENT DOCUMENTS

| | | |
|---|---|---|
| WO | 2011/058947 A1 | 5/2011 |
| WO | 2011/158821 A1 | 12/2011 |
| WO | 2012/043502 A1 | 4/2012 |
| WO | 2014/112365 A1 | 7/2014 |
| WO | 2016/163120 A1 | 10/2016 |
| WO | 2016/203751 A1 | 12/2016 |
| WO | 2018/025691 A1 | 2/2018 |

OTHER PUBLICATIONS

Banno et al., "A Novel Two-Varistors (a-Si/SiN/a-Si) selected Complementary Atom Switch (2V-1CAS) for Nonvolatile Crossbar Switch with Multiple Fan-outs," 2015 IEEE International Electron Devices Meeting Technical Digest, IEEE, 2015, pp. 2.5.1 to 2.5.4, 4 pages total.

International Search Report dated Jun. 19, 2018 issued by the International Searching Authority in International application No. PCT/JP2018/014567.

Written Opinion dated Jun. 19, 2018 issued by the International Searching Authority in International application No. PCT/JP2018/014567.

* cited by examiner

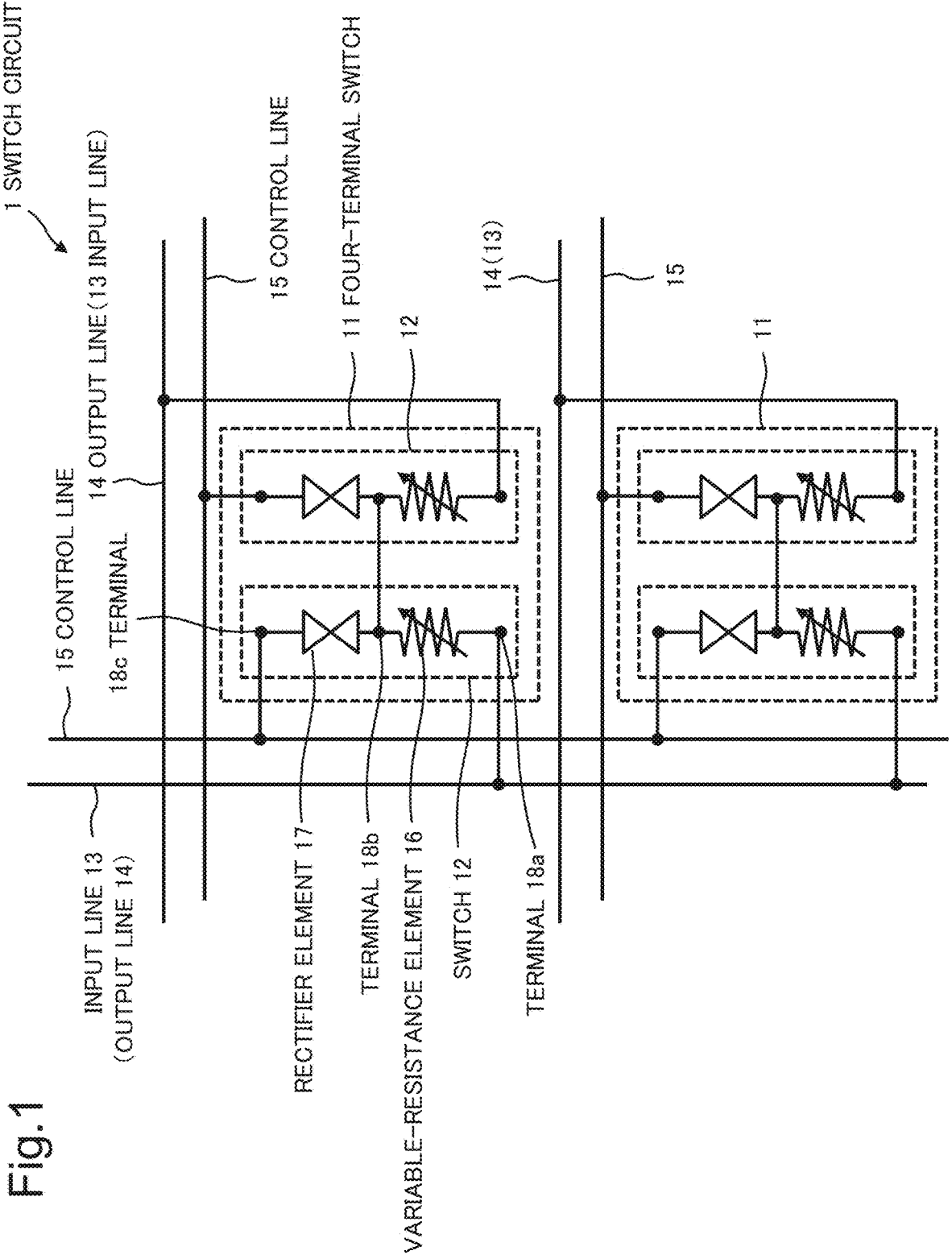

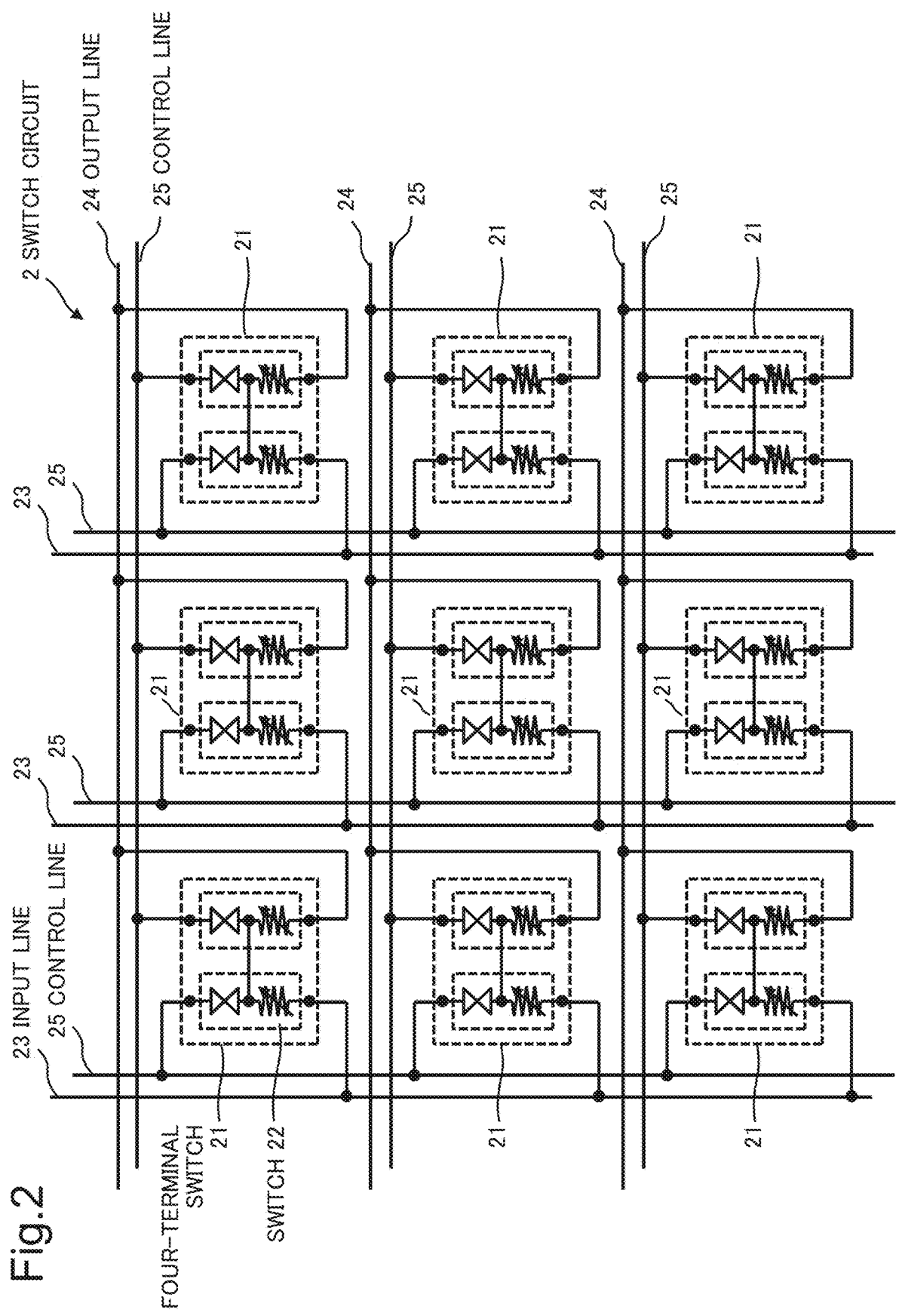

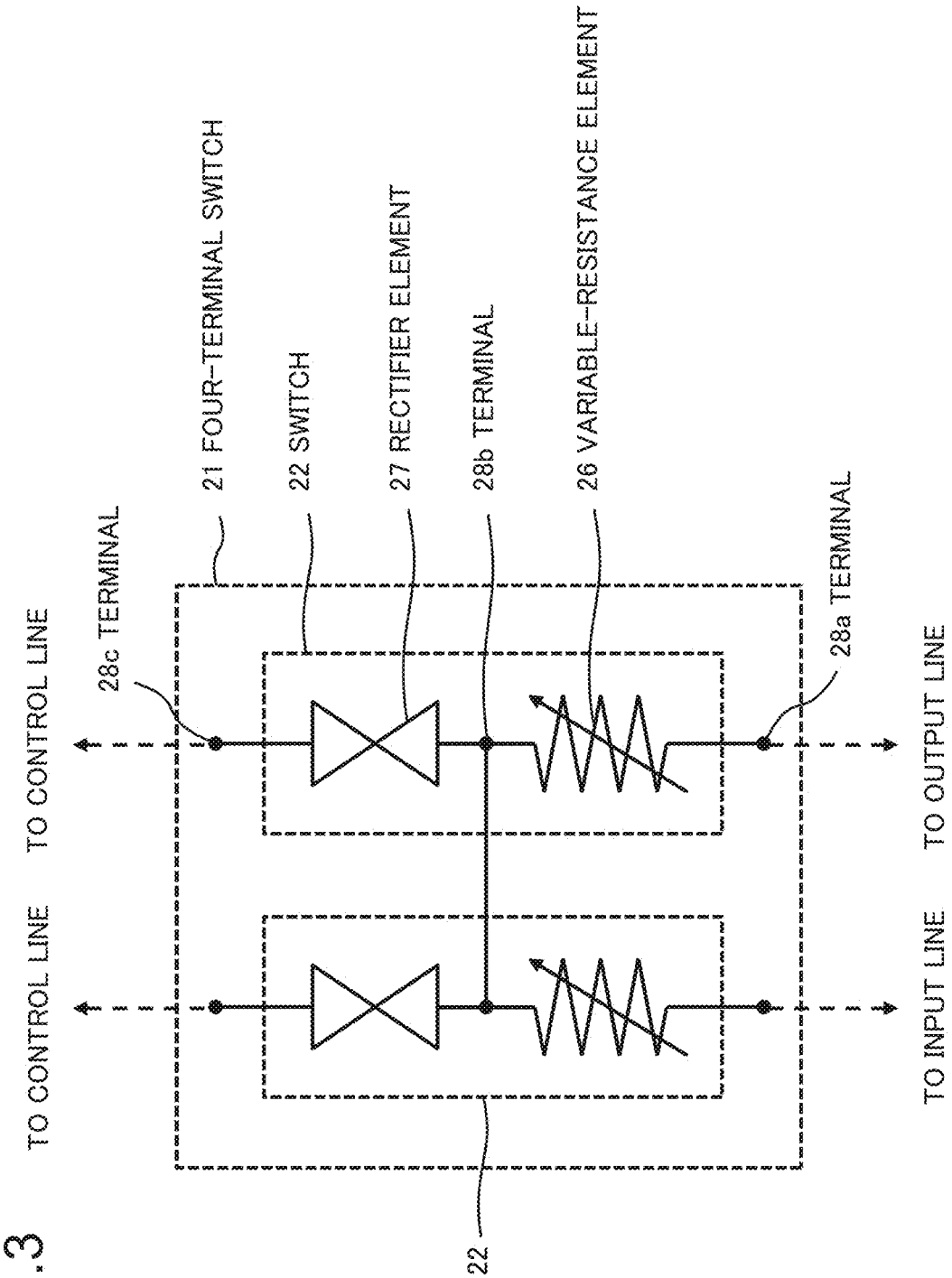

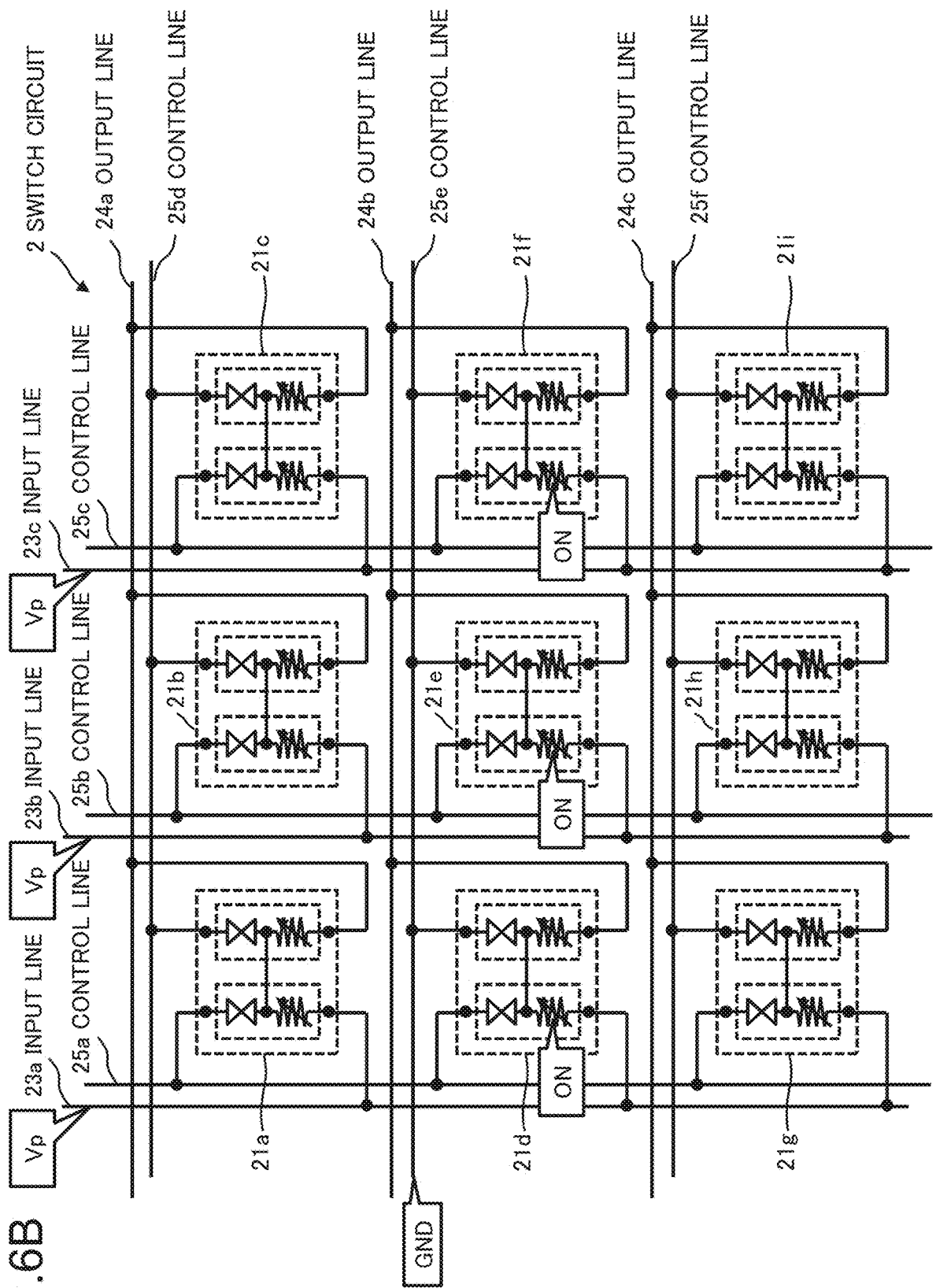

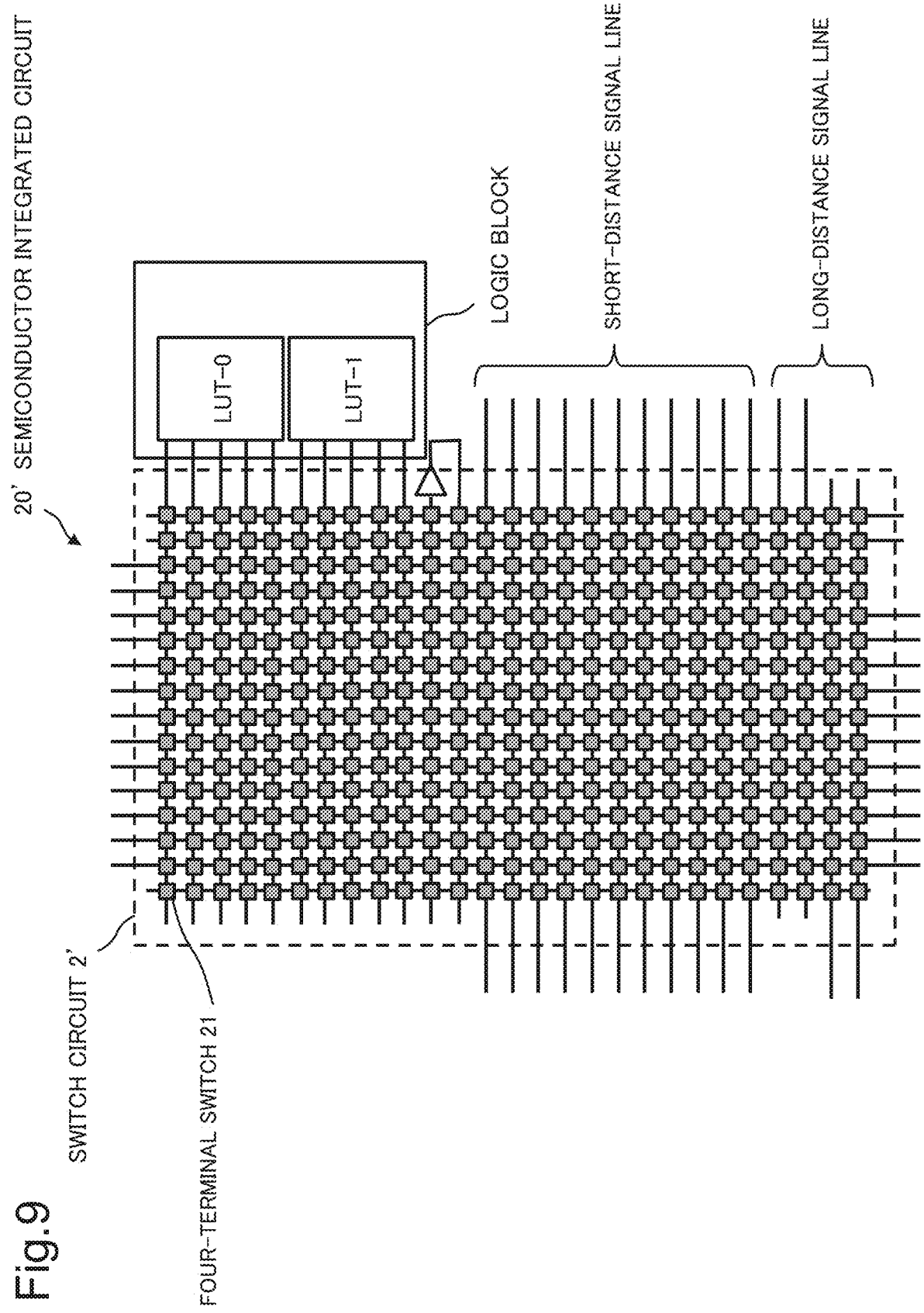

207 BARRIER INSULATING FILM

222 HARD MASK FILM

207 BARRIER INSULATING FILM

THIRD ELECTRODE 211
RECTIFYING LAYER STACK 208
SECOND ELECTRODE 210
ION-CONDUCTING LAYER 209

213 SECOND HARD MASK FILM
212 FIRST HARD MASK FILM

223 PHOTORESIST

224 PHOTORESIST

214 PROTECTIVE INSULATING FILM

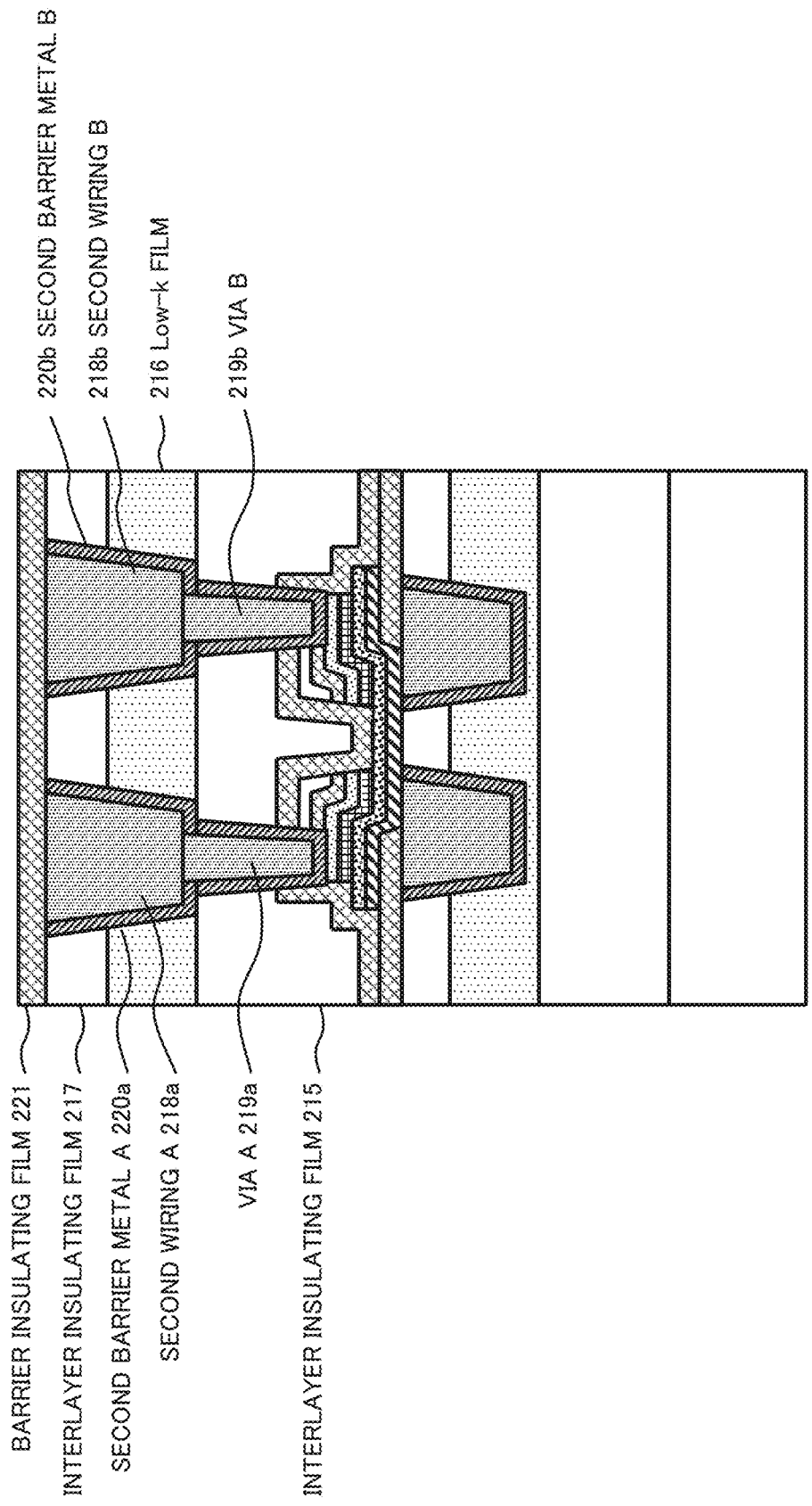

SWITCH CIRCUIT, SEMICONDUCTOR DEVICE USING SAME, AND SWITCHING METHOD

This application is a National Stage Entry of PCT/JP2018/014567 filed on Apr. 5, 2018, which claims priority from Japanese Patent Application 2017-078050 filed on Apr. 11, 2017, the contents of all of which are incorporated herein by reference, in their entirety.

TECHNICAL FIELD

The present invention relates to a switch circuit using a variable-resistance element, a semiconductor device using the same, and a switching method.

BACKGROUND ART

In order to increase multifunctionality of a programmable logic circuit and expand use thereof in electronic equipment or the like, downsizing of a switch interconnecting logic cells and also decrease of on-resistance of the switch are required. A variable resistance type switch using a variable-resistance element using precipitation of metal in an ion-conducting layer conducting a metal ion is known to have a smaller size and smaller on-resistance than a semiconductor switch. PTL 1 discloses a two-terminal variable resistance type switch, and PTL 2 discloses a three-terminal variable resistance type switch, respectively.

A two-terminal switch is configured to sandwich an ion-conducting layer between an active electrode supplying a metal ion to the ion-conducting layer and an inert electrode not supplying a metal ion. A connection between both electrodes is turned on/off by formation and disappearance of a metal bridge in the ion-conducting layer. The two-terminal switch has a simple configuration, is easy to manufacture, and allows downsizing on the order of nanometers. On the other hand, a three-terminal switch is configured to share active electrodes or inert electrodes of two two-terminal switches as a control terminal and has higher reliability in a switch operation compared with a two-terminal switch.

A porous polymer being disclosed in PTL 3 and having silicon, oxygen, and carbon as main components is preferable as an ion-conducting layer. An ion-conducting layer using a porous polymer can keep dielectric breakdown voltage high even when a metal bridge is formed, and therefore has excellent reliability in a switch operation.

A method of integrating a two-terminal variable resistance type switch into a semiconductor device and a method of integrating a three-terminal variable resistance type switch into a semiconductor device, in order to apply a variable-resistance element to a wiring selector switch in a programmable logic circuit, are disclosed in PTL 4 and PTL 5, respectively. According to PTLs 4 and 5, in a manufacturing process of a semiconductor device including a copper wiring, a variable-resistance element can be integrated with high density merely by adding two photomasks, with a configuration using the copper wiring also as an active electrode of the variable-resistance element.

At this time, there is a problem that, when an ion-conducting layer is directly formed on the copper wiring, a surface of the copper wiring is oxidized and leak current increases. NPL 1 resolves the problem by sandwiching a metal thin film between the copper wiring and the ion-conducting layer in such a way that the metal thin film is oxidized by oxygen in the ion-conducting layer and becomes a part of the ion-conducting layer. Further, NPL 1 discloses that, at this time, thermal stability of a metal bridge is enhanced and retentive strength of the metal bridge is improved by the metal being taken into the metal bridge, and current required for a transition from an on-state to an off-state does not increase.

Specific forms of a wiring selector switch in a programmable logic circuit include a crossbar switch in which switch elements are arranged at intersections of input lines and output lines. In a crossbar switch, at least one selection transistor needs to be provided for each switch element in order to suppress sneak current when signal transmission is performed and to select a switch element when a switch operation is performed. However, there is a problem that, due to a large area of the transistor, the switch element cannot be downsized even though a variable-resistance element itself is small.

PTL 6 discloses a three-terminal switch downsized by connecting a bipolar rectifier element in series to a control terminal of a variable-resistance element, in place of a transistor. A switch operation of the three-terminal switch is performed through the rectifier element, and switching current is limited by arriving current of the rectifier element. Further, the rectifier element suppresses sneak current into an adjacent switch through the control terminal, and false switching of the adjacent switch can be prevented.

However, the method in PTL 6 has a problem that a plurality of switch elements existing on an input line or an output line in the crossbar switch cannot be turned on for supporting multi-fan-out. The reason is that current flows into an input line or an output line through a switch element being previously turned on, and false switching occurs at a switch element separate from a switch element intended to be turned on.

Then, PTL 7 discloses a four-terminal switch allowing support of multi-fan-out by connecting one rectifier element in series to each of two two-terminal switches constituting a three-terminal switch. The four-terminal switch suppresses sneak current and improves selectivity of a switch element when a switch operation is performed. PTL 7 also discloses a rectifier element improving a rectifying characteristic by providing a buffer layer specified with a work function and a relative dielectric constant on a rectifying layer of the rectifier element.

CITATION LIST

Patent Literature

PTL 1: Japanese Translation of PCT International Application Publication No. 2002-536840
PTL 2: International Application Publication No. WO 2012/043502
PTL 3: International Application Publication No. WO 2011/058947
PTL 4: International Application Publication No. WO 2010/079816
PTL 5: International Application Publication No. WO 2011/158821
PTL 6: International Application Publication No. WO 2014/112365
PTL 7: International Application Publication No. WO 2016/203751

Non Patent Literature

NPL 1: M. Tada, T. Sakamoto, N. Banno, K. Okamoto, N. Iguchi, H. Hada and M. Miyamura, "ON-State Reliability of Atom Switch Using Alloy Electrodes," IEEE Transactions on Electron Devices, Vol. 60, pp. 3534 to 3540 (2013)

SUMMARY OF INVENTION

Technical Problem

However, the technology disclosed in PTL 7 has an issue as follows. For example, a case of turning on a plurality of switch elements supporting multi-fan-out, the elements existing on an input line or an output line in a crossbar switch, is assumed. In this case, when a switch element being previously turned on exists on the input line or the output line, current flows in such a way that the other output line or input line connected to the switch element in the on-state is charged through the switch element in the on-state.

Further, a case of turning off a plurality of switch elements supporting multi-fan-out, the elements existing on an input line or an output line in a crossbar switch, is assumed. In this case, when a switch element in an on-state separate from the switch element being turned off exists on the input line or the output line, current flows in such a way that the other output line or input line connected to the switch element in the on-state is discharged through the switch element in the on-state.

When a plurality of switch elements supporting multi-fan-out are switched as described above, unnecessary current flows through a switch element in an on-state separate from a switch element in a switch operation, as described above. The current delays a switch operation time due to an effect of parasitic capacitance of a wiring or the like, and increases leak current, and therefore hinders a high-speed switch operation with a short pulse.

The present invention has been made in view of the issue described above, and an object of the present invention is to provide a switch circuit capable of a high-speed and highly reliable switch operation in a crossbar switch using a variable-resistance element supporting multi-fan-out.

Solution to Problem

A switch circuit according to the present invention includes: a plurality of four-terminal switches in each of which two switches each including a variable-resistance element and a rectifier element being connected in series, each of the variable-resistance element and the rectifier element including two terminals, are connected at the terminals on the series connections; an input line and an output line each connected to the terminal of the variable-resistance element in the two switches, the terminal being separate from the terminal on the series connection, a number of at least one of the input line and the output line being more than one; and a control line each connected to the terminal of the rectifier element in the two switches, the terminal being separate from the terminal on the series connection, wherein, out of the variable-resistance elements in a plurality of the four-terminal switches out of the four-terminal switches connected to one of the input line and the output line, the control line turns on or off, with the input line and the output line, a group of the variable-resistance elements connected to the input line and a group of the variable-resistance elements connected to the output line, sequentially for each group.

A semiconductor device according to the present invention includes a semiconductor integrated circuit including the switch circuit according to the present invention.

A switching method according to the present invention is a switching method of a switch circuit including: a plurality of four-terminal switches in each of which two switches each including a variable-resistance element and a rectifier element being connected in series, each of the variable-resistance element and the rectifier element including two terminals, are connected at the terminals on the series connections; an input line and an output line each connected to the terminal of the variable-resistance element in the two switches, the terminal being separate from the terminal on the series connection, a number of at least one of the input line and the output line being more than one; and a control line each connected to the terminal of the rectifier element in the two switches, the terminal being separate from the terminal on the series connection, the switching method including, out of the variable-resistance elements in a plurality of the four-terminal switches out of the four-terminal switches connected to one of the input line and the output line, turning on or off a group of the variable-resistance elements connected to the input line and a group of the variable-resistance elements connected to the output line, sequentially for each group.

Advantageous Effects of Invention

The present invention is able to provide a switch circuit capable of a high-speed and highly reliable switch operation in a crossbar switch using a variable-resistance element supporting multi-fan-out.

BRIEF DESCRIPTION OF DRAWINGS

FIG. 1 is a diagram illustrating a configuration of a switch circuit according to a first example embodiment of the present invention.

FIG. 2 is a diagram illustrating a configuration of a switch circuit according to a second example embodiment of the present invention.

FIG. 3 is a diagram illustrating a configuration of a four-terminal switch in the switch circuit according to the second example embodiment of the present invention.

FIG. 6B is a diagram for illustrating the operation of turning on a plurality of four-terminal switches in the switch circuit according to the second example embodiment of the present invention.

FIG. 9 is a diagram illustrating a configuration example of a semiconductor integrated circuit using the switch circuit according to the second example embodiment of the present invention.

FIG. 13M is a cross-sectional view for illustrating the process when integrating the four-terminal switch in the switch circuit according to the second example embodiment of the present invention into a semiconductor integrated circuit.

EXAMPLE EMBODIMENT

Figure 4A:
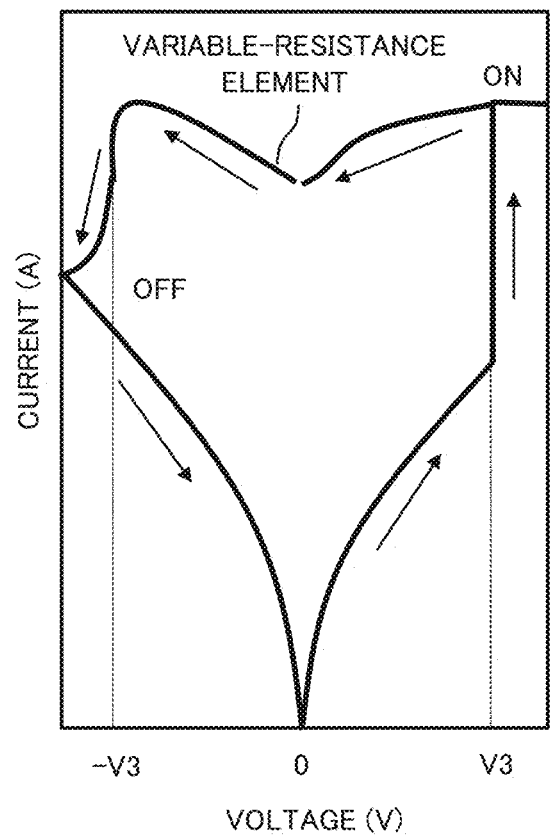
FIG. 4A is a diagram illustrating a current-voltage characteristic of a variable-resistance element in the switch circuit according to the second example embodiment of the present invention.

Example embodiments of the present invention will be described below with reference to drawings. Although technically preferred limitations for implementing the present invention are applied to the example embodiments described below, the scope of the invention is not limited thereto.

First Example Embodiment

FIG. 1 is a diagram illustrating a configuration of a switch circuit according to a first example embodiment of the present invention. A switch circuit 1 according to the present example embodiment includes a plurality of four-terminal switches 11 in each of which two switches 12 each including a variable-resistance element 16 and a rectifier element 17 connected in series, each of the variable-resistance element 16 and the rectifier element 17 including two terminals, are connected at terminals 18b on the series connections. Additionally, the switch circuit 1 includes an input line 13 and an output line 14 each connected to a terminal 18a of a variable-resistance element 16 in the two switches 12, the terminal 18a being separate from the terminal 18b on the series connection and a number of at least one of the input line 13 and the output line 14 being more than one. Additionally, the switch circuit 1 includes control lines 15 each connected to a terminal 18c of a rectifier element 17 in the two switches 12, the terminal 18c being separate from the terminal 18b on the series connection. Additionally, out of variable-resistance elements 16 in a plurality of four-terminal switches 11 out of four-terminal switches 11 connected to one of the input line 13 and the output line 14, the control line 15 turns on or off, with the input line 13 and the output line 14, a group of variable-resistance elements 16 connected to the input line 13 and a group of variable-resistance elements 16 connected to the output line 14, sequentially for each group.

When switching a plurality of switches supporting multi-fan-out, the switch circuit 1 according to the present example embodiment can eliminate a separate switch in an on-state on an input line or an output line connected to a switch in a switch operation. Alternatively, unnecessary current caused by a separate switch in an on-state can be suppressed. Consequently, delay in a switch operation time due to an effect of parasitic capacitance, and leak current are suppressed. Consequently, a high-speed switch operation with short pulses can be performed with high reliability.

As described above, the present example embodiment can provide a switch circuit capable of a high-speed and highly reliable switch operation in a crossbar switch using a variable-resistance element supporting multi-fan-out.

Second Example Embodiment

FIG. 2 is a diagram illustrating a configuration of a switch circuit 2 according to a second example embodiment of the present invention. Further, FIG. 3 is a diagram illustrating a configuration of a four-terminal switch 21 in the switch circuit 2 according to the present example embodiment.

The switch circuit 2 is a crossbar switch including a plurality of input lines 23, a plurality of output lines 24, a plurality of four-terminal switches 21 each provided at each intersection of an input line 23 and an output line 24, and a plurality of control lines 25 for controlling on/off-states of the four-terminal switches 21. The input line 23 and the output line 24 are signal lines transmitting signals. While the input lines 23 and the output line 24 are provided three each in FIG. 2, the numbers of the lines are not limited to the above. The number of at least one of the input lines 23 and the output lines 24 has only to be more than one. Further, while the control lines 25 are provided along the input lines 23 and the output lines 24, the arrangement is not limited to the above as long as a four-terminal switch 21 to be turned on/off can be specified and on/off-states of the four-terminal switch 21 can be controlled.

In order to specify and turn on/off a desired four-terminal switch 21, the switch circuit 2 is connected to a driver circuit capable of applying predetermined voltage to or grounding a predetermined wiring out of the input line 23, the output line 24, and the control line 25 at a predetermined timing. Description of the driver circuit is omitted in FIG. 2. The driver circuit will be described later.

A four-terminal switch 21 has a configuration in which two switches 22 including a variable-resistance element 26 and a rectifier element 27 connected in series, each of the variable-resistance element 26 and the rectifier element 27 including two terminals, are connected at terminals 28b on the series connections, as illustrated in FIG. 3. Terminals 28a of the variable-resistance elements 26 in the two switches 22, being separate from the terminals 28b on the series connections, are connected to an input line 23 and an output line 24, respectively. Further, terminals 28c of the rectifier elements 27 in the two switches 22, being separate from the terminals 28b on the series connections, are connected to control lines 25, respectively.

A four-terminal switch 21 allows signal transmission between an input line 23 and an output line 24 by both of variable-resistance elements 26 in two switches 22 being turned on.

With an input line 23 and an output line 24, a control line 25 turns on or off variable-resistance elements 26 in a plurality of four-terminal switches 21 out of four-terminal switches 21 connected to one of the input line 23 and the output line 24. At this time, out of the variable-resistance elements 26 in the plurality of four-terminal switches 21, a group of variable-resistance elements 26 connected to the input line 23 and a group of variable-resistance elements 26 connected to the output line 24 are turned on or off sequentially for each group.

A variable-resistance element 26 includes a laminated structure of an active electrode, an ion-conducting layer, and an inert electrode. The active electrode supplies a metal ion to the ion-conducting layer, and the inert electrode does not supply a metal ion. By controlling voltage applied between both electrodes, a metal bridge is formed or disappears in the ion-conducting layer, and consequently a transition between a low-resistance state and a high-resistance state of resistance between both electrodes is made. In other words, the ion-conducting layer is a variable-resistance layer. The low-resistance state is an on-state and the high-resistance state is an off-state. The low-resistance state and the high-resistance state are nonvolatile, and on- and off-states are kept without applying voltage.

In each variable-resistance element 26 in two switches 22, inert electrodes or active electrodes are connected at terminals 28b. Accordingly, an input line 23 and an output line 24 are connected to the active electrodes or the inert electrodes.

A rectifier element 27 is a diode having bipolarity. The rectifier element 27 includes a laminated structure of an electrode, a rectifying layer, and an electrode. A rectifying characteristic can be improved by providing, between the electrode and the rectifying layer, a buffer layer a work function of which is smaller than a work function of the electrode and a relative dielectric constant of which is larger than a relative dielectric constant of the rectifying layer.

When turning on/off a variable-resistance element 26, a rectifier element 27 suppresses inflow of current to a variable-resistance element 26 other than the variable-resistance element 26 to be turned on/off. Further, the rectifier element 27 performs current limiting when making a transition between on-/off-states of the variable-resistance element 26. Further, the rectifier element 27 adjusts a resistance value of the variable-resistance element 26 in an on-state. Additionally, the rectifier element 27 suppresses sneak current through a four-terminal switch 21 in an on-state upon signal transmission through an input line 23 and an output line 24.

FIG. 4A is a schematic diagram illustrating a current-voltage characteristic between an active electrode (on the terminal 28a side) and an inert electrode (on the terminal 28b side) of a variable-resistance element 26. When the inert electrode is grounded and positive voltage is applied to the active electrode, metal constituting the active electrode is ionized and is implanted into the ion-conducting layer. The implanted metal ion migrates to the inert electrode side and by receiving an electron at the inert electrode, precipitates in the ion-conducting layer as a metal bridge. By the inert electrode and the active electrode being connected by the metal bridge, the variable-resistance element 26 makes a transition to a low-resistance state (on) (voltage V3).

On the other hand, when the inert electrode is grounded and negative voltage is applied to the active electrode, a metal bridge dissolves by ionization and is recovered by the active electrode. Consequently, by the inert electrode and the active electrode being disconnected, the variable-resistance element 26 makes a transition to a high-resistance state (off) (voltage −V3). A resistance state is nonvolatile, and a low-resistance state and a high-resistance state are kept even when voltage application is stopped.

Figure 4B:
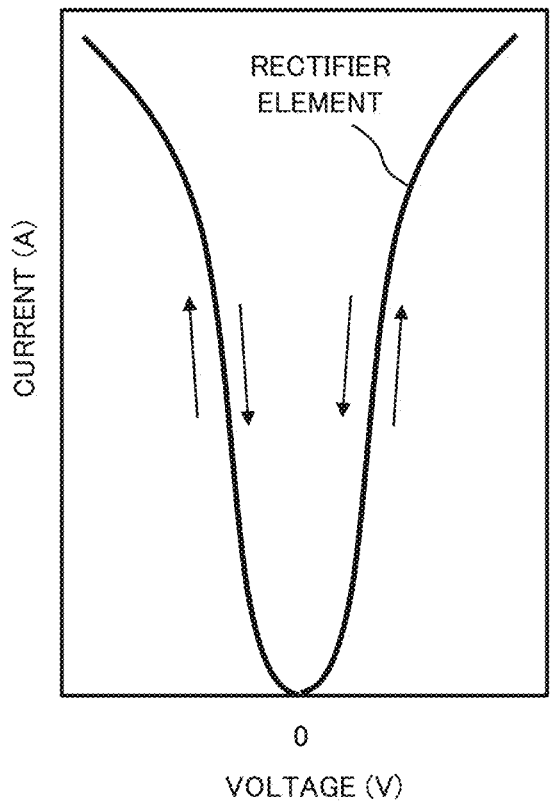
FIG. 4B is a diagram illustrating a current-voltage characteristic of a rectifier element in the switch circuit according to the second example embodiment of the present invention.

FIG. 4B is a schematic diagram illustrating a current-voltage characteristic between electrodes (between the terminal 28b and the terminal 28c) of a rectifier element 27. When voltage is applied between the electrodes, the rectifier element 27 exhibits a current-voltage characteristic which is nonlinear and also symmetric between the positive and negative electrodes through the rectifying layer. While high resistance is exhibited in a low voltage region, current exponentially increases as applied voltage increases. A resistance state is volatile, and when voltage application is stopped, a low-resistance state is released and becomes a high-resistance state.

Figure 4C:
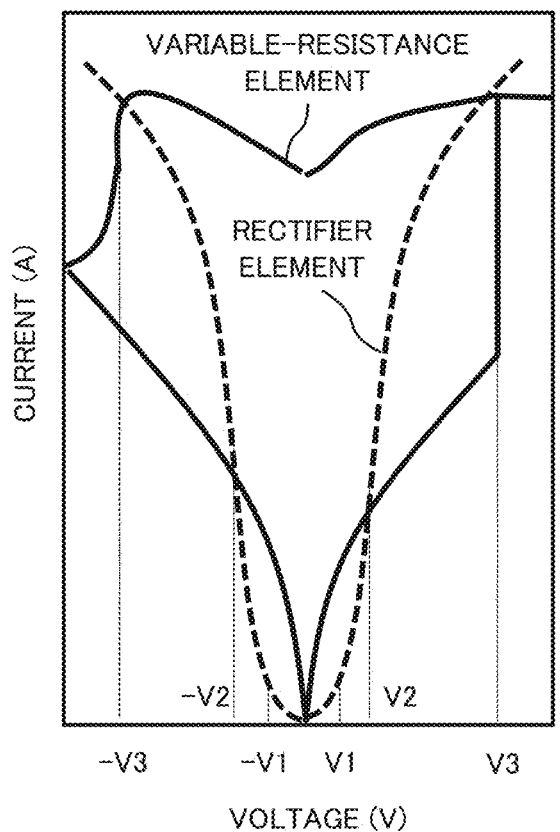
FIG. 4C is a diagram illustrating current-voltage characteristics of the variable-resistance element and the rectifier element in the switch circuit according to the second example embodiment of the present invention, being superposed on one another.
Figure 4D:
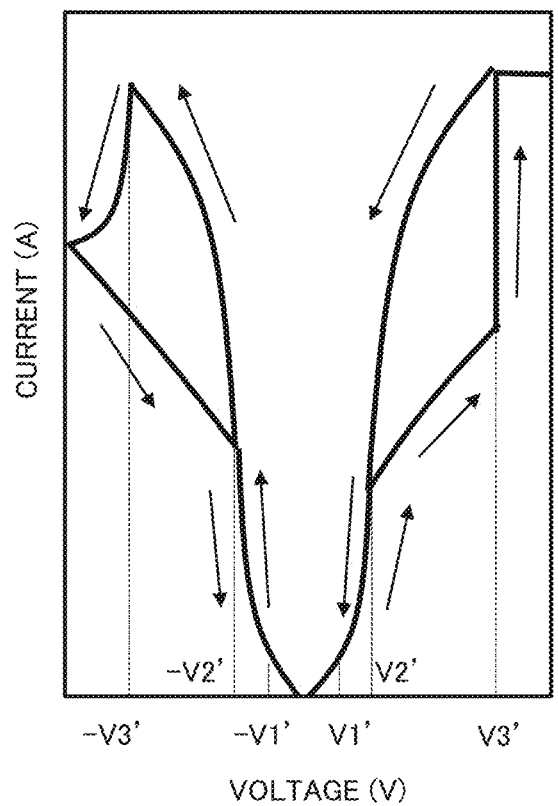
FIG. 4D is a diagram illustrating a current-voltage characteristic of a series connection of the variable-resistance element and the rectifier element in the switch circuit according to the second example embodiment of the present invention.

FIG. 4C is a schematic diagram illustrating the current-voltage characteristics of the variable-resistance element 26 in FIG. 4A and the rectifier element 27 in FIG. 4B, being superposed on one another. Further, FIG. 4D is a schematic diagram illustrating a current-voltage characteristic of a series connection of the variable-resistance element 26 and the rectifier element 27 in a switch 22. The current-voltage characteristic of the variable-resistance element 26 and the current-voltage characteristic of the rectifier element 27 in FIG. 4C illustrate a current-voltage characteristic between the terminal 28a and the terminal 28b, and a current-voltage characteristic between the terminal 28b and the terminal 28c, respectively. Further, the current-voltage characteristic of the series connection in FIG. 4D illustrates a current-voltage characteristic between the terminal 28a and the terminal 28c.

When the terminal 28c is grounded and positive voltage is applied to the terminal 28a in FIG. 4D, a current-voltage characteristic of the high-resistance rectifier element 27 is exhibited in a process up to a voltage V2' corresponding to a voltage V2 at which resistance of the rectifier element 27 exceeds resistance of the variable-resistance element 26 in FIG. 4C. Accordingly, sneak current is suppressed by a high-resistance characteristic of the rectifier element 27 at a low-voltage V1' (corresponding to V1 in FIG. 4C) being a read-out voltage in an off-state. In a process with the applied voltage being V2' or greater, the resistance of the variable-resistance element 26 exceeds the resistance of the rectifier element 27, and a current-voltage characteristic of the variable-resistance element 26 including V3' (corresponding to V3 in FIG. 4C) at which the variable-resistance element 26 makes a transition to a low-resistance state is exhibited. In a process of decreasing the applied voltage from V3', a current-voltage characteristic of the rectifier element 27 being high-resistance compared with the variable-resistance element 26 in the low-resistance state is exhibited.

On the other hand, when the terminal 28c is grounded and negative voltage is applied to the terminal 28a in FIG. 4D, in a process up to −V3' (corresponding to −V3 in FIG. 4C), the variable-resistance element 26 is in a low-resistance state, and therefore a current-voltage characteristic of the high-resistance rectifier element 27 is exhibited. When the variable-resistance element 26 makes a transition to a high-resistance state at −V3', in a process down to a voltage −V2' corresponding to a voltage −V2 at which the resistance of the rectifier element 27 exceeds the resistance of the variable-resistance element 26 in FIG. 4C, a current-voltage characteristic of the high-resistance variable-resistance element 26 is exhibited. In a process of further decreasing the applied voltage from −V2', a current-voltage characteristic of the rectifier element 27 being high-resistance compared with the variable-resistance element 26 is exhibited. Accordingly, sneak current is suppressed by a high-resistance characteristic of the rectifier element 27 at a low-voltage −V1' (corresponding to −V1 in FIG. 4C) being a read-out voltage in an off-state.

A method of turning on or off variable-resistance elements 26 in a plurality of four-terminal switches 21 out of four-terminal switches 21 connected to one of input lines 23 and output lines 24 in a switch circuit 2, the variable-resistance element 26 supporting multi-fan-out, will be described below.

Figure 5A:
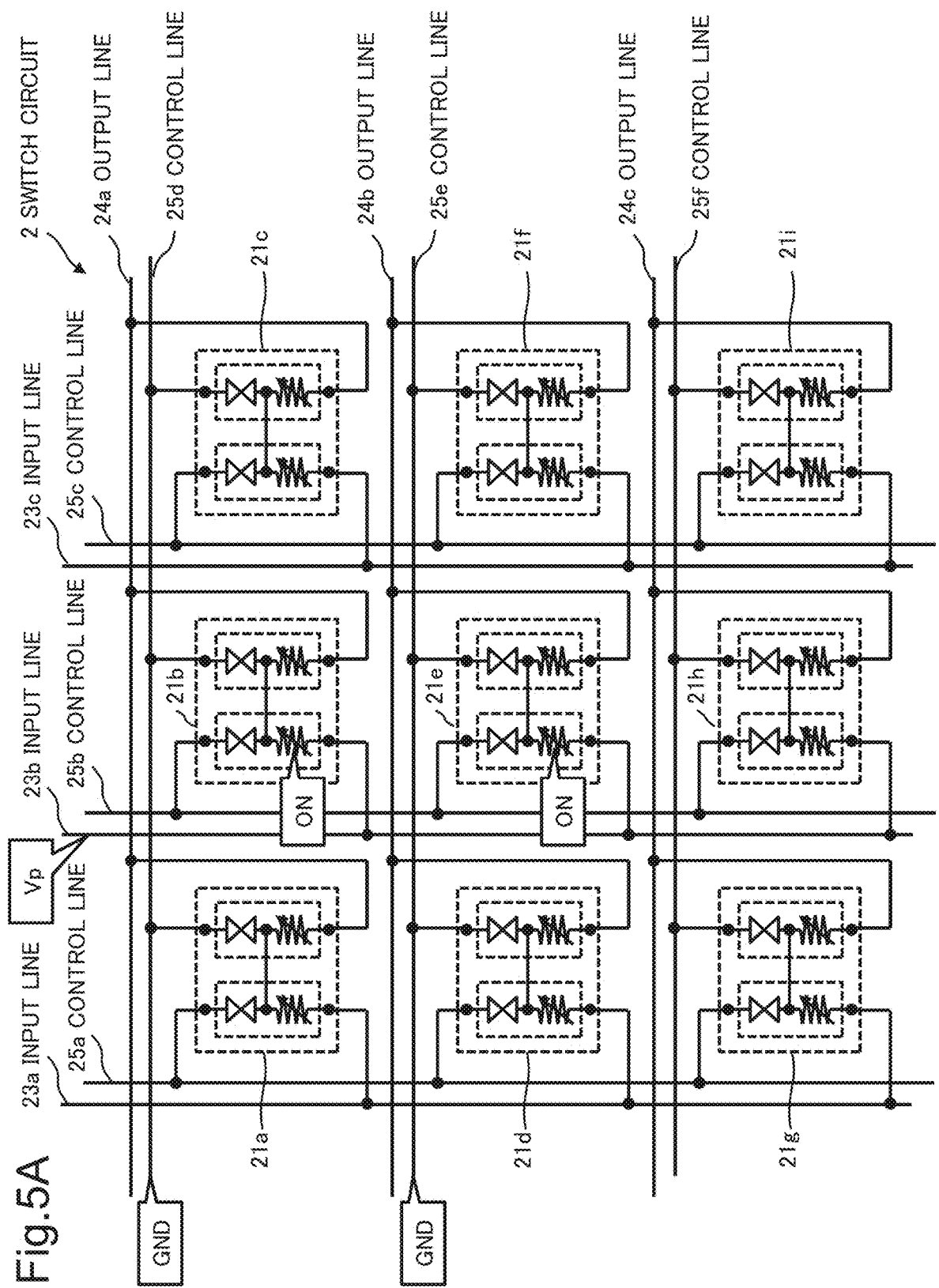
FIG. 5A is a diagram for illustrating an operation of turning on a plurality of four-terminal switches in the switch circuit according to the second example embodiment of the present invention.
Figure 5B:
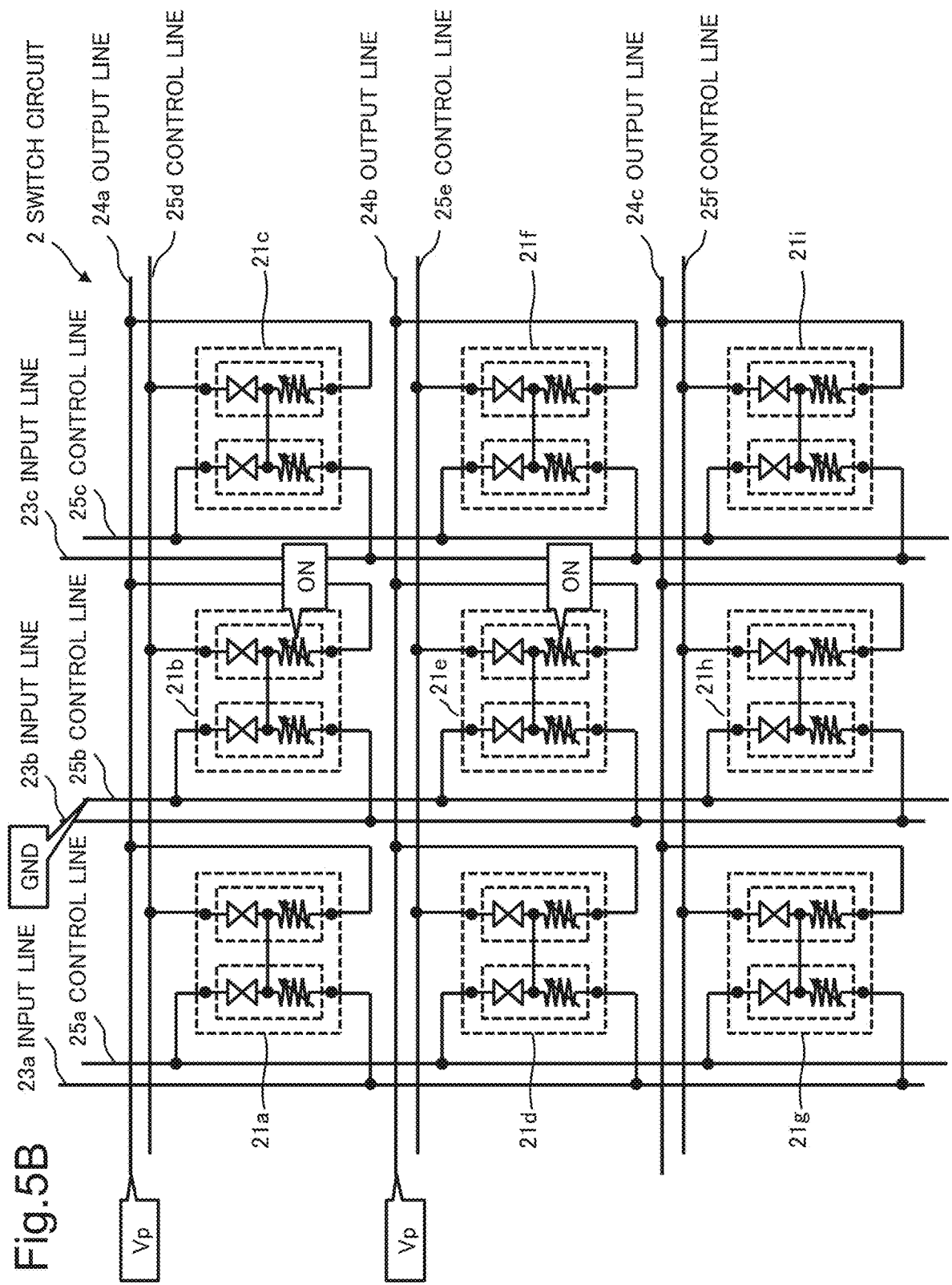
FIG. 5B is a diagram for illustrating the operation of turning on a plurality of four-terminal switches in the switch circuit according to the second example embodiment of the present invention.

FIG. 5A and FIG. 5B are diagrams for illustrating an operation of turning on a four-terminal switch 21b and a four-terminal switch 21e in order to output a signal input to an input line 23b to an output line 24a and an output line 24b. It is assumed that four-terminal switches 21a to 21i are in a high-resistance state, and input lines 23a to 23c, output lines 24a to 24c, and control lines 25a to 25f are in a high-impedance state at the start of the operation.

First, a case of first turning on a group of variable-resistance elements connected to the input line 23b in the four-terminal switches 21b and 21e as illustrated in FIG. 5A and then turning on a group of variable-resistance elements connected to the output lines 24a and 24b in the four-terminal switches 21b and 21e as illustrated in FIG. 5B will be described.

First, as illustrated in FIG. 5A, variable-resistance elements connected to the input line 23b in the four-terminal switches 21b and 21e are turned on. Specifically, the control line 25d and the control line 25e are grounded (GND) and a voltage Vp (program voltage) sufficient for making a transition of a variable-resistance element from an off-state to an on-state is applied to the input line 23b. Consequently, the variable-resistance elements connected to the input line 23b are turned on. A voltage −Vp may be applied to the control line 25d and the control line 25e, and the input line 23b may be grounded.

At this time, for example, it is assumed that the variable-resistance element connected to the input line 23b in the four-terminal switch 21b is first turned on, and then the variable-resistance element connected to the input line 23b in the four-terminal switch 21e is turned on. When the variable-resistance element connected to the input line 23b in the four-terminal switch 21e is turned on, the variable-resistance element connected to the output line 24a in the four-terminal switch 21b is not turned on, and therefore the four-terminal switch 21b is not turned on. Accordingly, the input line 23b and the output line 24a are electrically separated by the four-terminal switch 21b. Consequently, even when a voltage Vp is applied to the input line 23b when the variable-resistance element connected to the input line 23b in the four-terminal switch 21e is turned on, current charging the output line 24a connected to the four-terminal switch 21b does not flow.

The variable-resistance element connected to the input line 23b in the four-terminal switch 21b and the variable-resistance element connected to the input line 23b in the four-terminal switch 21e may be simultaneously turned on.

Subsequently, as illustrated in FIG. 5B, the variable-resistance elements connected to the output lines 24a and 24b in the four-terminal switches 21b and 21e are turned on.

Specifically, the control line 25b is grounded, and a voltage Vp is applied to the output lines 24a and 24b. Consequently, the variable-resistance elements connected to the output lines 24a and 24b are turned on. A voltage −Vp may be applied to the control line 25b, and the output lines 24a and 24b may be grounded.

At this time, for example, it is assumed that the variable-resistance element connected to the output line 24a in the four-terminal switch 21b is first turned on, and then the variable-resistance element connected to the output line 24b in the four-terminal switch 21e is turned on. When the variable-resistance element in the four-terminal switch 21e is turned on, the two variable-resistance elements in the four-terminal switch 21b are turned on, and therefore the four-terminal switch 21b is turned on. However, the control line 25b and the output line 24a are electrically separated by a rectifier element connected to the control line 25b in the four-terminal switch 21b. Accordingly, even when the control line 25b is grounded in order to turn on the variable-resistance element connected to the output line 24b in the four-terminal switch 21e, current discharging the output line 24a connected to the four-terminal switch 21b does not flow.

The variable-resistance element connected to the output line 24a in the four-terminal switch 21b and the variable-resistance element connected to the output line 24b in the four-terminal switch 21e may be simultaneously turned on.

Next, a case of first turning on the variable-resistance elements connected to the output lines 24a and 24b in the four-terminal switches 21b and 21e illustrated in FIG. 5B and then turning on the variable-resistance elements connected to the input line 23b in the four-terminal switches 21b and 21e illustrated in FIG. 5A will be described.

First, as illustrated in FIG. 5B, the variable-resistance elements connected to the output lines 24a and 24b in the four-terminal switches 21b and 21e are turned on. Specifically, the control line 25b is grounded, and a voltage Vp is applied to the output lines 24a and 24b. Consequently, the variable-resistance elements connected to the output lines 24a and 24b are turned on. A voltage −Vp may be applied to the control line 25b, and the output lines 24a and 24b may be grounded.

At this time, for example, it is assumed that the variable-resistance element connected to the output line 24a in the four-terminal switch 21b is first turned on, and then the variable-resistance element connected to the output line 24b in the four-terminal switch 21e is turned on. When the variable-resistance element connected to the output line 24b in the four-terminal switch 21e is turned on, the variable-resistance element connected to the input line 23b in the four-terminal switch 21b is not turned on, and therefore the four-terminal switch 21b is not turned on. Accordingly, the input line 23b and the output line 24a are electrically separated by the four-terminal switch 21b. Consequently, even when a voltage Vp is applied to the output line 24b when the variable-resistance element connected to the output line 24b in the four-terminal switch 21e is turned on, current charging the output line 24a connected to the four-terminal switch 21b does not flow.

The variable-resistance element connected to the output line 24a in the four-terminal switch 21b and the variable-resistance element connected to the output line 24b in the four-terminal switch 21e may be simultaneously turned on.

Subsequently, as illustrated in FIG. 5A, the variable-resistance elements connected to the input line 23b in the four-terminal switches 21b and 21e are turned on. Specifically, the control line 25d and the control line 25e are grounded, and a voltage Vp is applied to the input line 23b. Consequently, the variable-resistance element connected to the input line 23b is turned on. A voltage −Vp may be applied to the control line 25d and the control line 25e, and the input line 23b may be grounded.

At this time, for example, it is assumed that the variable-resistance element connected to the input line 23b in the four-terminal switch 21b is first turned on, and then the variable-resistance element connected to the input line 23b in the four-terminal switch 21e is turned on. When the variable-resistance element in the four-terminal switch 21e is turned on, the two variable-resistance elements in the four-terminal switch 21b are turned on, and therefore the four-terminal switch 21b is turned on. Consequently, the input line 23b and the output line 24a are electrically connected. Accordingly, when a voltage Vp is applied to the input line 23b in order to turn on the variable-resistance element connected to the input line 23b in the four-terminal switch 21e, current charging the output line 24a connected to the four-terminal switch 21b flows.

Accordingly, the switch circuit 2 does not include a case of first sequentially turning on the variable-resistance elements connected to the output lines 24a and 24b in the four-terminal switches 21b and 21e, and then sequentially turning on the variable-resistance elements connected to the input line 23b in the four-terminal switches 21b and 21e.

The variable-resistance element connected to the input line 23b in the four-terminal switch 21b and the variable-resistance element connected to the input line 23b in the four-terminal switch 21e may be simultaneously turned on. Consequently, current charging the output line 24a connected to the four-terminal switch 21b, as described above, can be suppressed.

As described above, when outputting a signal input to the input line 23b to the output line 24a and the output line 24b in the switch circuit 2, a group of variable-resistance elements connected to the input line are first turned on, and then a group of variable-resistance elements connected to the output lines are turned on. Alternatively, the group of variable-resistance elements connected to the input line and the group of variable-resistance elements connected to the output lines are turned on simultaneously for each group.

Thus, when switching a plurality of switches supporting multi-fan-out in the switch circuit 2, a separate switch in an on-state on an input line or an output line connected to a switch in an on-operation can be eliminated. Alternatively, unnecessary current caused by a separate switch in an on-state can be suppressed.

On the other hand, in a case of a method of first turning on the two variable-resistance elements in the four-terminal switch 21b and then turning on the two variable-resistance elements in the four-terminal switch 21e, unlike the method by the switch circuit 2, when the four-terminal switch 21e is turned on, the four-terminal switch 21b is already turned on. At this time, when a voltage Vp is applied to the input line 23b in order to turn on the variable-resistance element connected to the input line 23b in the four-terminal switch 21e, current charging the output line 24a flows through the four-terminal switch 21b being already turned on. On the other hand, when the variable-resistance element connected to the output line 24b in the four-terminal switch 21e is turned on, the control line 25b and the output line 24a are electrically separated by the rectifier element connected to the control line 25b in the four-terminal switch 21b. Accordingly, even when the control line 25b is grounded in order to turn on the variable-resistance element connected to the output line 24b in the four-terminal switch 21e, current discharging the output line 24a does not flow.

As described above, in a known method of first turning on the two variable-resistance elements in the four-terminal switch 21b and then turning on the two variable-resistance elements in the four-terminal switch 21e, unnecessary current flows through the four-terminal switch 21b being already turned on, when the four-terminal switch 21e is turned on. Accordingly, the known method is distinguished from the method by the switch circuit 2 according to the present example embodiment.

Figure 6A:
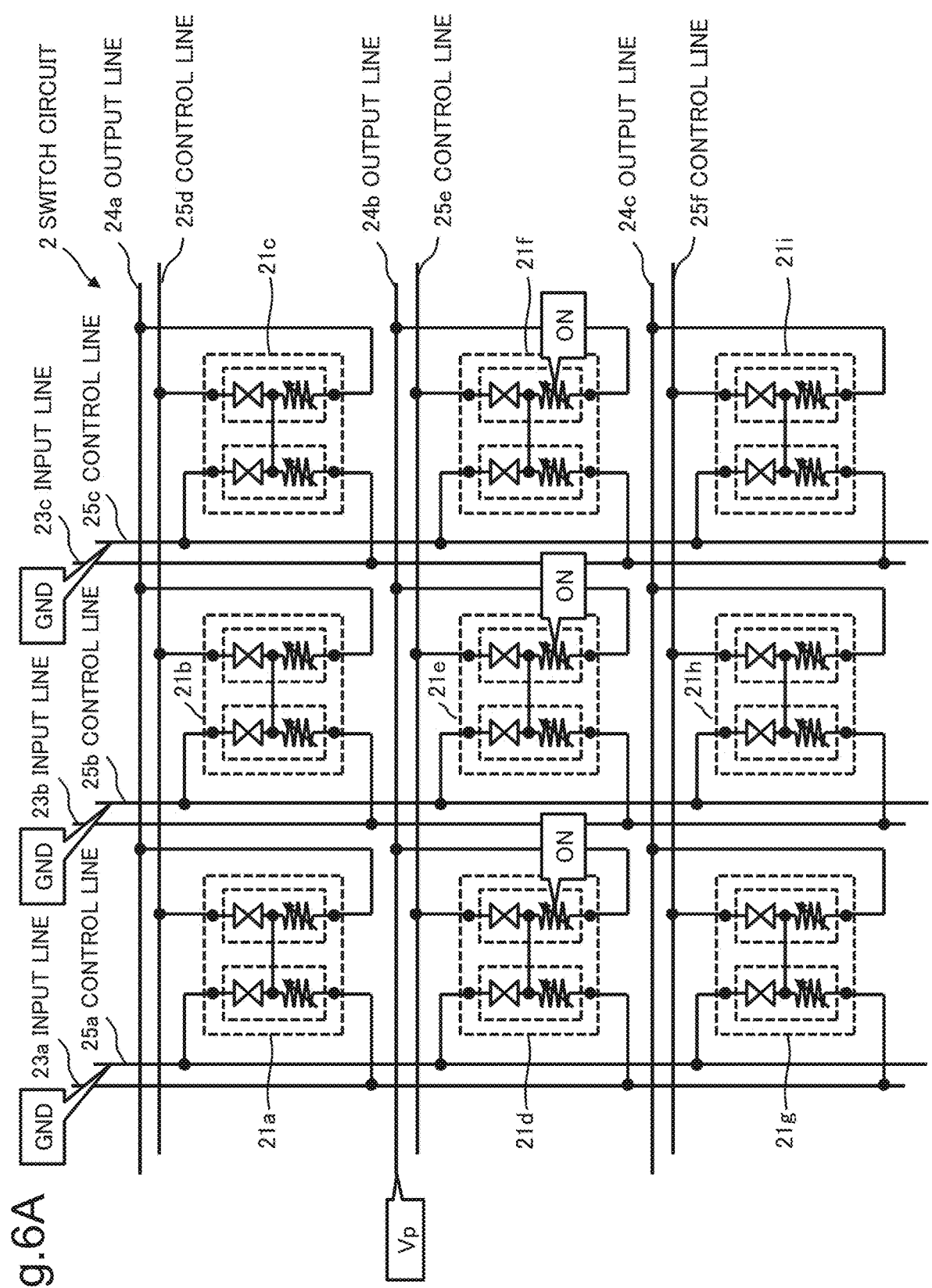
FIG. 6A is a diagram for illustrating an operation of turning on a plurality of four-terminal switches in the switch circuit according to the second example embodiment of the present invention.

FIG. 6A and FIG. 6B are diagrams for illustrating an operation of turning on four-terminal switches 21d, 21e, and 21f in order to output signals input to input lines 23a, 23b, and 23c to an output line 24b. It is assumed that four-terminal switches 21a to 21i are in a high-resistance state, and the input lines 23a to 23c, output lines 24a to 24c, and control lines 25a to 25f are in a high-impedance state at the start of the operation.

First, as illustrated in FIG. 6A, variable-resistance elements connected to the output line 24b in the four-terminal switches 21d, 21e, and 21f are turned on. Specifically, the control lines 25a, 25b, and 25c are grounded, and a voltage Vp sufficient for making a transition of a variable-resistance element from an off-state to an on-state is applied to the output line 24b. Consequently, variable-resistance elements connected to the output line 24b are turned on. A voltage −Vp may be applied to the control lines 25a, 25b, and 25c, and the output line 24b may be grounded.

It is assumed that the variable-resistance elements connected to the output line 24b in the four-terminal switches 21d, 21e, and 21f are turned on in this order. In this case, for the same reason as described in FIG. 5A, even when a voltage Vp is applied to the output line 24b when the variable-resistance elements connected to the output line 24b in the four-terminal switches 21e and 21f are turned on, current charging the input line 23a connected to the four-terminal switch 21d does not flow.

The variable-resistance elements connected to the output line 24b in the four-terminal switches 21d, 21e, and 21f may be simultaneously turned on.

Next, as illustrated in FIG. 6B, variable-resistance elements connected to the input lines 23a, 23b, and 23c in the four-terminal switches 21d, 21e, and 21f are turned on. Specifically, the control line 25e is grounded, and a voltage Vp is applied to the input lines 23a, 23b, and 23c. Consequently, the variable-resistance elements connected to the input lines 23a, 23b, and 23c are turned on. A voltage −Vp may be applied to the control line 25e, and the input lines 23a, 23b, and 23c may be grounded.

It is assumed that the variable-resistance elements connected to the input lines 23a, 23b, and 23c in the four-terminal switches 21d, 21e, and 21f are turned on in this order. In this case, for the same reason as described in FIG. 5B, even when the control line 25e is grounded when the variable-resistance elements connected to the input lines 23b and 23c in the four-terminal switches 21e and 21f are turned on, current discharging the input line 23a connected to the four-terminal switch 21d does not flow.

The variable-resistance elements connected to the input lines 23a, 23b, and 23c in the four-terminal switches 21d, 21e, and 21f may be simultaneously turned on.

As described above, when signals input to the input lines 23a, 23b, and 23c are output to the output line 24b in the switch circuit 2, a group of variable-resistance elements connected to the output line are first turned on, and then a group of variable-resistance elements connected to the input lines are turned on. Alternatively, the group of variable-resistance elements connected to the output line and the group of variable-resistance elements connected to the input lines are turned on simultaneously for each group.

Thus, for the same reason as described in FIG. 5A and FIG. 5B, when turning on a plurality of switches supporting multi-fan-out, a separate switch in an on-state on an input line or an output line connected to a switch in a switch operation can be eliminated. Alternatively, unnecessary current caused by a separate switch in an on-state can be suppressed.

Figure 7A:
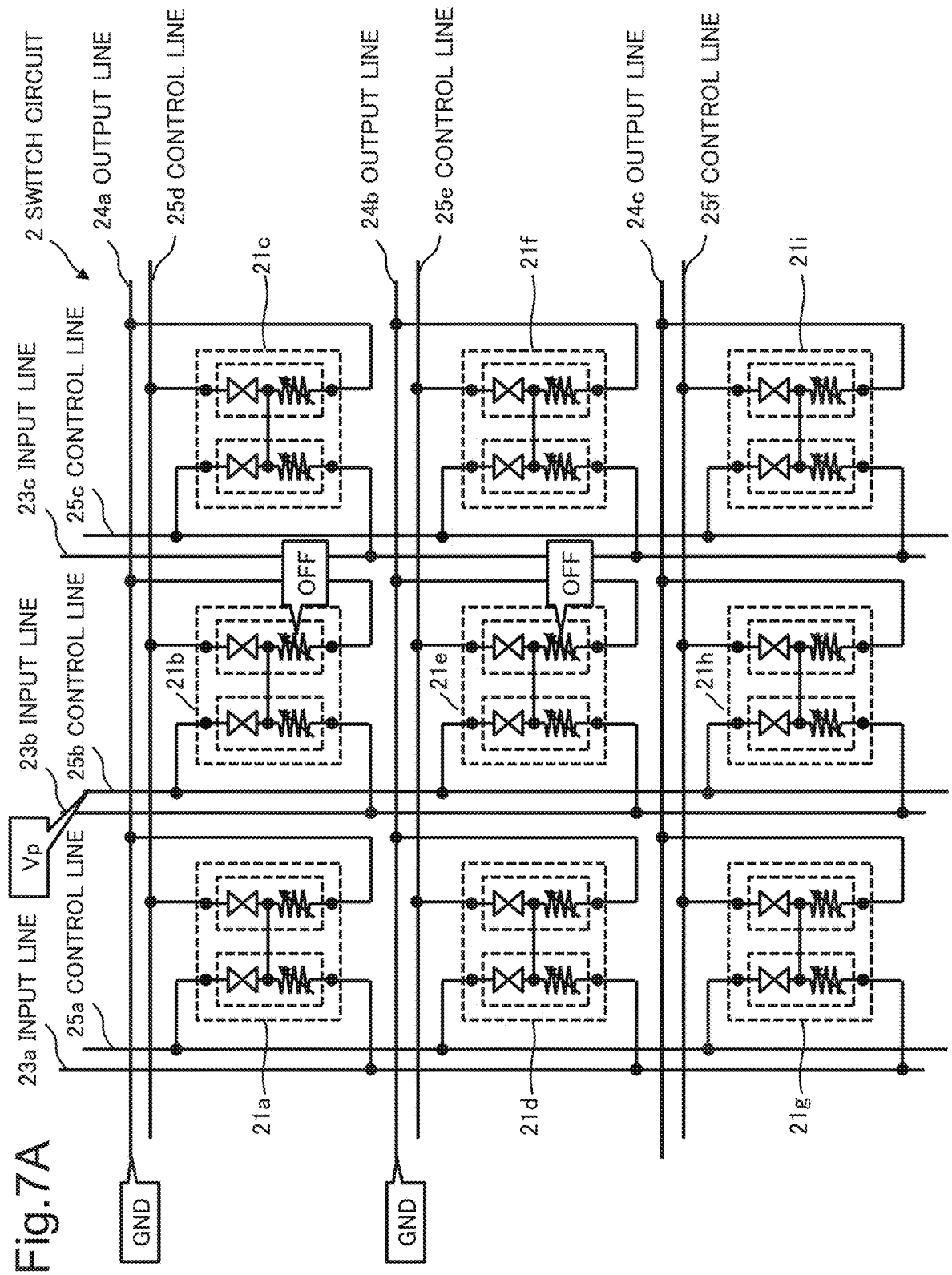
FIG. 7A is a diagram for illustrating an operation of turning off a plurality of four-terminal switches in the switch circuit according to the second example embodiment of the present invention.
Figure 7B:
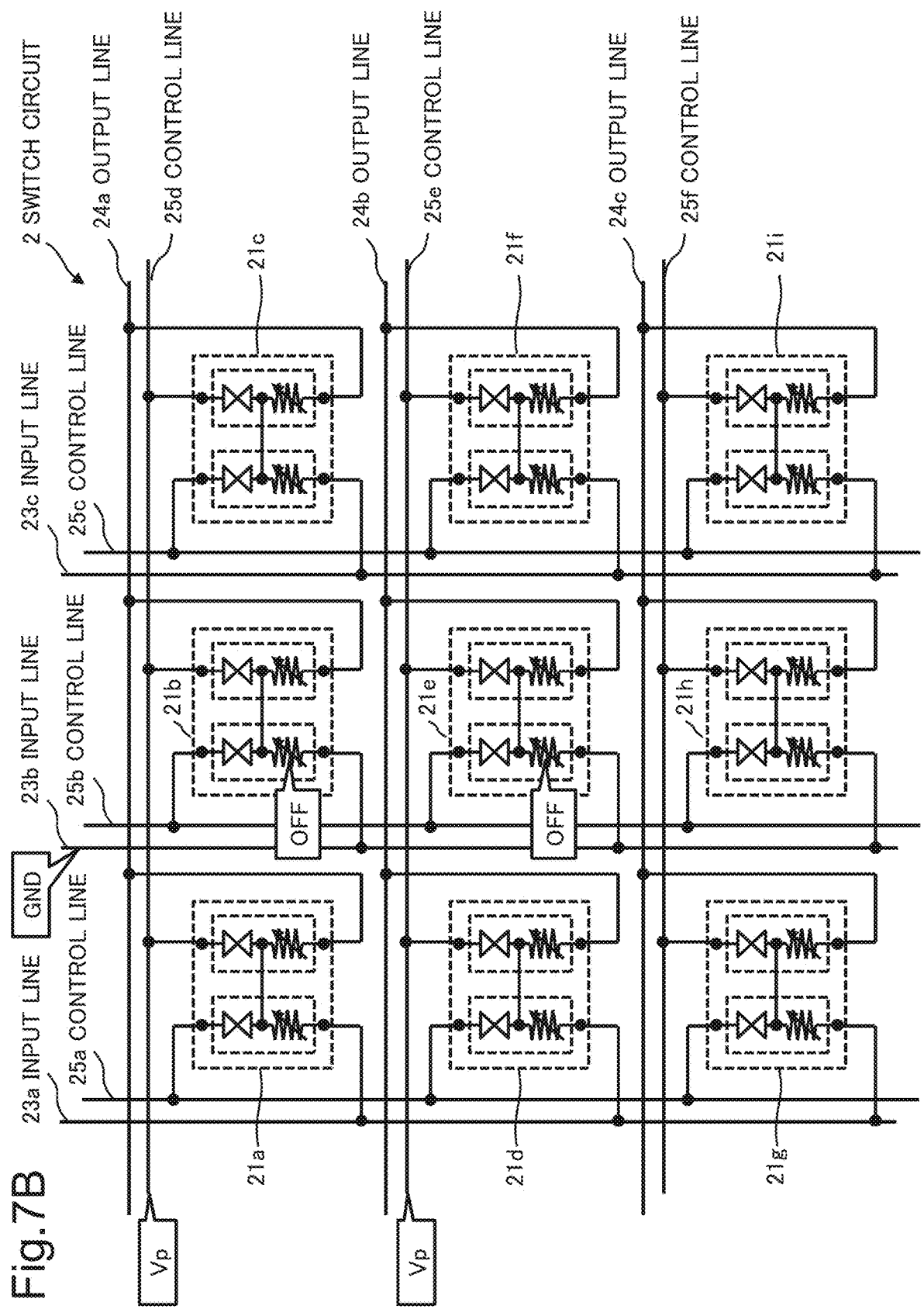
FIG. 7B is a diagram for illustrating the operation of turning off a plurality of four-terminal switches in the switch circuit according to the second example embodiment of the present invention.

FIG. 7A and FIG. 7B are diagrams for illustrating an operation of turning off four-terminal switches 21b and 21e being turned on for outputting a signal input to an input line 23b to output lines 24a and 24b. It is assumed that four-terminal switches 21a to 21i other than the four-terminal switches 21b and 21e are in a high-resistance state and input lines 23a to 23c, the output lines 24a to 24c, and control lines 25a to 25f are in a high-impedance state at the start of the operation.

First, a case of first turning off variable-resistance elements connected to the output lines 24a and 24b in the four-terminal switches 21b and 21e illustrated in FIG. 7A and then turning off variable-resistance elements connected to the input line 23b in the four-terminal switches 21b and 21e illustrated in FIG. 7B will be described.

First, as illustrated in FIG. 7A, the variable-resistance elements connected to the output lines 24a and 24b in the four-terminal switches 21b and 21e are turned off. Specifically, a voltage Vp sufficient for making a transition of a variable-resistance element from an on-state to an off-state is applied to the control line 25b, and the output lines 24a and 24b are grounded. Consequently, the variable-resistance elements connected to the output lines 24a and 24b are turned off. The control line 25b may be grounded, and a voltage −Vp may be applied to the output lines 24a and 24b.

At this time, for example, it is assumed that the variable-resistance element connected to the output line 24a in the four-terminal switch 21b is first turned off, and then the variable-resistance element connected to the output line 24b in the four-terminal switch 21e is turned off. When the variable-resistance element connected to the output line 24a in the four-terminal switch 21b is turned off, the four-terminal switch 21e is turned on. However, the control line 25b and the four-terminal switch 21e are electrically separated by a rectifier element connected to the control line 25b in the four-terminal switch 21e. Consequently, even when a voltage Vp is applied to the control line 25b in order to turn on the variable-resistance element connected to the output line 24a in the four-terminal switch 21b, current through the four-terminal switch 21e does not flow.

The variable-resistance element connected to the output line 24a in the four-terminal switch 21b and the variable-resistance element connected to the output line 24b in the four-terminal switch 21e may be simultaneously turned off.

Subsequently, the variable-resistance elements connected to the input line 23b in the four-terminal switches 21b and 21e illustrated in FIG. 7B are turned off. Specifically, the input line 23b is grounded, and a voltage Vp is applied to the control lines 25d and 25e. Consequently, the variable-resistance element connected to the input line 23b is turned off. A voltage −Vp may be applied to the input line 23b, and the control lines 25d and 25e may be grounded.

At this time, for example, it is assumed that the variable-resistance element connected to the input line 23b in the first four-terminal switch 21b is first turned off, and then the variable-resistance element connected to the input line 23b in the four-terminal switch 21e is turned off. When the variable-resistance element connected to the input line 23b in the four-terminal switch 21b is turned off, the variable-resistance element connected to the output line 24b in the four-terminal switch 21e is turned off. Accordingly, the input line 23b and the output line 24b are electrically separated. Consequently, even when the input line 23b is grounded in order to turn off the variable-resistance element connected to the input line 23b in the four-terminal switch 21b, current discharging the output line 24b does not flow.

The variable-resistance element connected to the input line 23b in the four-terminal switch 21b and the variable-resistance element connected to the input line 23b in the four-terminal switch 21e may be simultaneously turned off.

Next, a case of first turning off the variable-resistance elements connected to the input line 23b in the four-terminal switches 21b and 21e illustrated in FIG. 7B, and then turning off the variable-resistance elements connected to the output lines 24a and 24b in the four-terminal switches 21b and 21e illustrated in FIG. 7A will be described.

First, the variable-resistance elements connected to the input line 23b in the four-terminal switches 21b and 21e illustrated in FIG. 7B are turned off. Specifically, the input line 23b is grounded, and a voltage Vp is applied to the control lines 25d and 25e. Consequently, the variable-resistance element connected to the input line 23b is turned off. A voltage −Vp may be applied to the input line 23b, and the control lines 25d and 25e may be grounded.

At this time, for example, it is assumed that the variable-resistance element connected to the input line 23b in the first four-terminal switch 21b is first turned off, and then the variable-resistance element connected to the input line 23b in the four-terminal switch 21e is turned off. When the variable-resistance element connected to the input line 23b in the four-terminal switch 21b is turned off, the four-terminal switch 21e is turned on. Accordingly, the input line 23b and the output line 24b are electrically connected. Consequently, when the input line 23b is grounded in order to turn off the variable-resistance element connected to the input line 23b in the four-terminal switch 21b, current discharging the output line 24b flows.

Accordingly, the switch circuit 2 does not include a case of first sequentially turning off the variable-resistance elements connected to the input line 23b in the four-terminal switches 21b and 21e, and then sequentially turning off the variable-resistance elements connected to the output lines 24a and 24b in the four-terminal switches 21b and 21e.

The variable-resistance element connected to the input line 23b in the four-terminal switch 21b and the variable-resistance element connected to the input line 23b in the four-terminal switch 21e may be simultaneously turned off. Consequently, current discharging the output line 24b can be suppressed.

Subsequently, as illustrated in FIG. 7A, the variable-resistance elements connected to the output lines 24a and 24b in the four-terminal switches 21b and 21e are turned off. Specifically, a voltage Vp is applied to the control line 25b, and the output lines 24a and 24b are grounded. Consequently, the variable-resistance elements connected to the output lines 24a and 24b are turned off. The control line 25b may be grounded, and a voltage −Vp may be applied to the output lines 24a and 24b.

At this time, for example, it is assumed that the variable-resistance element connected to the output line 24a in the first four-terminal switch 21b is first turned off, and then the variable-resistance element connected to the output line 24b in the next four-terminal switch 21e is turned off. When the variable-resistance element connected to the output line 24a in the four-terminal switch 21b is turned off, the variable-resistance element connected to the output line 24b in the four-terminal switch 21e is turned on. However, the control line 25b and the output line 24b are electrically separated by a rectifier element connected to the control line 25b in the four-terminal switch 21e. Consequently, even when the control line 25b is grounded in order to turn on the variable-resistance element connected to the output line 24a in the four-terminal switch 21b, current discharging the output line 24b connected to the four-terminal switch 21e does not flow.

The variable-resistance element connected to the output line 24a in the four-terminal switch 21b and the variable-resistance element connected to the output line 24b in the four-terminal switch 21e may be simultaneously turned off.

As described above, when the four-terminal switches 21b and 21e being turned on for outputting a signal input to the input line 23b to the output line 24a and the output line 24b are turned off in the switch circuit 2, a group of variable-resistance elements connected to the output lines 24a and 24b are first turned off, and then a group of variable-resistance elements connected to the input line 23b are turned off. Alternatively, the group of variable-resistance elements connected to the output lines 24a and 24b, and the group of variable-resistance elements connected to the input line 23b are turned off simultaneously for each group.

Consequently, when a plurality of switches supporting multi-fan-out are turned off in the switch circuit 2, unnecessary current caused by a separate switch in an on-state on an input line or an output line connected to a switch in an off-operation can be suppressed.

On the other hand, in a case of a method of first turning off the two variable-resistance elements in the four-terminal switch 21b and then turning off the two variable-resistance elements in the four-terminal switch 21e, unlike the method by the switch circuit 2, when the four-terminal switch 21b is turned off, the four-terminal switch 21e is being turned on. At this time, in a case of first turning off the variable-resistance element connected to the input line 23b in the four-terminal switch 21b, when the input line 23b is grounded, current discharging the output line 24b flows through the four-terminal switch 21e being turned on. On the other hand, when the variable-resistance element connected to the output line 24a in the four-terminal switch 21b is first turned off, the control line 25b and the output line 24b are electrically separated by the rectifier element connected to the control line 25b in the four-terminal switch 21e. Consequently, even when the control line 25b is grounded in order to turn on the variable-resistance element connected to the output line 24a in the four-terminal switch 21b, current discharging the output line 24b does not flow.

As described above, in a known method of first turning off the two variable-resistance elements in the four-terminal switch 21b and then turning off the two variable-resistance elements in the four-terminal switch 21e, when the four-terminal switch 21b is turned off, current flows through the four-terminal switch 21e being turned on. Consequently, the known method is distinguished from the method by the switch circuit 2 according to the present example embodiment.

As described above, in the switch circuit 2 according to the present example embodiment, out of variable-resistance elements in a plurality of four-terminal switches out of four-terminal switches connected to one of input lines and output lines, a group of variable-resistance elements connected to the input line and a group of variable-resistance elements connected to the output line are turned on or off for each group in a specified order.

Specifically, out of variable-resistance elements in a plurality of four-terminal switches out of four-terminal switches connected to one of input lines and output lines, a group of variable-resistance elements connected to the one of the input lines and the output lines are first turned on. Further, out of variable-resistance elements in a plurality of four-terminal switches out of four-terminal switches connected to one of input lines and output lines, a group of variable-resistance elements separate from variable-resistance elements connected to the one of the input lines and the output lines are first turned off.

Further, in the switch circuit 2 according to the present example embodiment, out of variable-resistance elements in a plurality of four-terminal switches out of four-terminal switches connected to one of input lines and output lines, a group of variable-resistance elements connected to an input line and a group of variable-resistance elements connected to an output line are turned on or off simultaneously for each group.

Thus, when switching a plurality of switches supporting multi-fan-out, the switch circuit 2 according to the present example embodiment can eliminate a separate switch in an on-state on an input line or an output line connected to a switch in a switch operation. Alternatively, unnecessary current caused by a separate switch in an on-state can be suppressed. Consequently, delay in a switch operation time due to an effect of parasitic capacitance, and leak current are suppressed. Consequently, a high-speed switch operation with short pulses can be performed with high reliability.

Figure 8A:
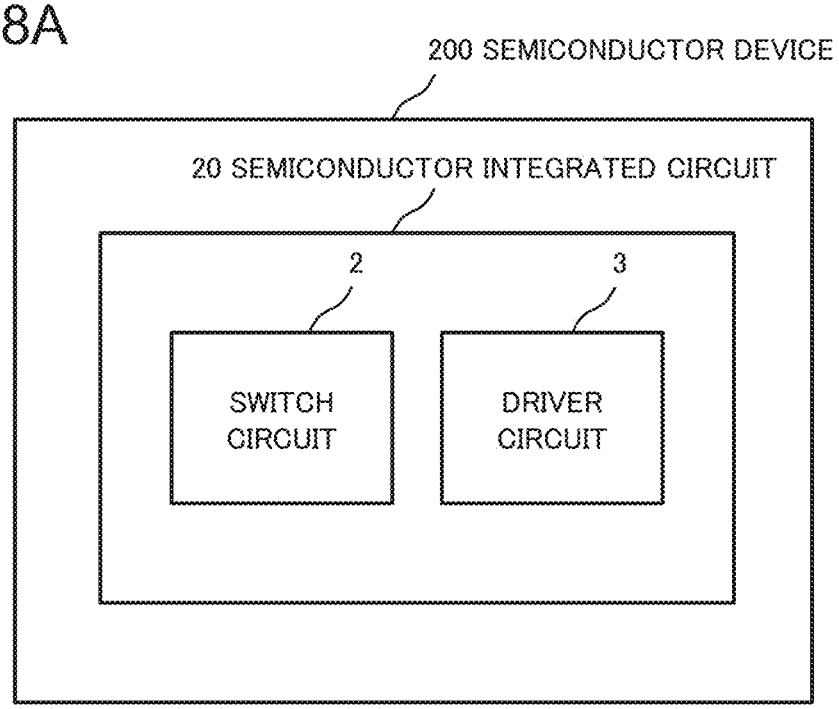
FIG. 8A is a block diagram illustrating a configuration of a semiconductor device using the switch circuit according to the second example embodiment of the present invention.

FIG. 8A is a block diagram illustrating a configuration of a semiconductor device using the switch circuit 2 according to the present example embodiment. A semiconductor device 200 includes a semiconductor integrated circuit 20 including a multilayer copper wiring and may incorporate the switch circuit 2 into the multilayer copper wiring. Further, the semiconductor integrated circuit 20 may provide a driver circuit 3 operating the switch circuit 2. The semiconductor device 200 includes semiconductor integrated circuits 20 such as a memory circuit including a complementary metal oxide semiconductor (CMOS) transistor and a bipolar transistor, a logic circuit such as a microprocessor, and a circuit equipped with the above at the same time. The semiconductor device 200 may also be packaged by resin, metal, ceramics, or the like.

Figure 8B:
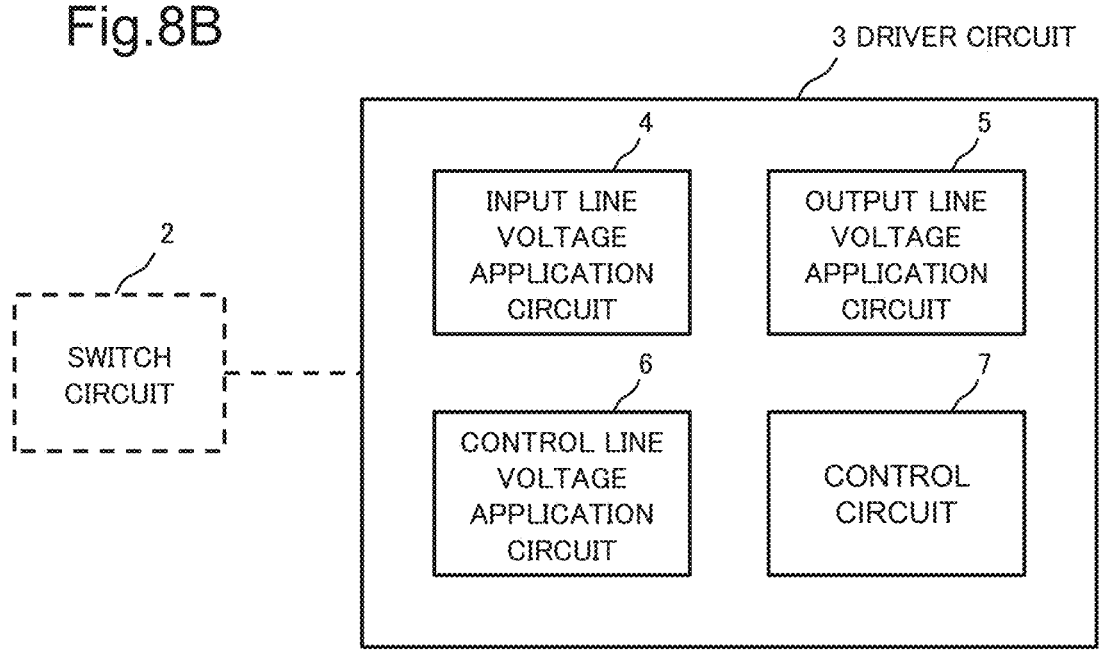
FIG. 8B is a block diagram illustrating a configuration of a driver circuit in the switch circuit according to the second example embodiment of the present invention.

FIG. 8B is a block diagram illustrating a configuration of the driver circuit 3 operating the switch circuit 2. The driver circuit 3 includes an input line voltage application circuit 4, an output line voltage application circuit 5, a control line voltage application circuit 6, and a control circuit 7. The input line voltage application circuit 4, the output line voltage application circuit 5, and the control line voltage application circuit 6 performs application of a predetermined voltage to and grounding on an input line, an output line, and a control line, respectively. The control circuit 7 controls the input line voltage application circuit 4, the output line voltage application circuit 5, and the control line voltage application circuit 6 in such a way as to perform a voltage application scheme in the switching method according to the present example embodiment described in FIG. 5A, FIG. 5B, FIG. 6A, FIG. 6B, FIG. 7A, and FIG. 7B on an input line, an output line, and a control line. The driver circuit 3 is formed of a CMOS transistor and a multilayer copper wiring.

Further, the semiconductor device 200 may be connected to an electronic circuit device, an optical circuit device, a quantum circuit device, a micromachine, micro electro mechanical systems (MEMS), or the like; and the switch circuit 2 may be used as a switch when a connection is made. Further, the switch circuit 2 according to the present example embodiment may be used as a nonvolatile memory other than as a switch.

FIG. 9 is a diagram illustrating a configuration example of a semiconductor integrated circuit using a switch circuit according to the present example embodiment. A semiconductor integrated circuit 20' includes a switch circuit 2' being a crossbar switch including four-terminal switches 21 and a logic block connected to the switch circuit 2'. For example, the logic block includes a look-up table (LUT) connected to the switch circuit 2'. The LUT is capable of inputting and outputting of signals such as inputting a signal switched by the switch circuit 2' and outputting a value related to the input signal. The switch circuit 2' may also include a short-distance signal line for transmitting a signal to an adjacent separate crossbar switch and a long-distance signal line for transmitting a signal to a distant crossbar switch. Further, the switch circuit 2' may include a switch for connecting/disconnecting a signal between signal lines in crossbar switches.

Figure 10:
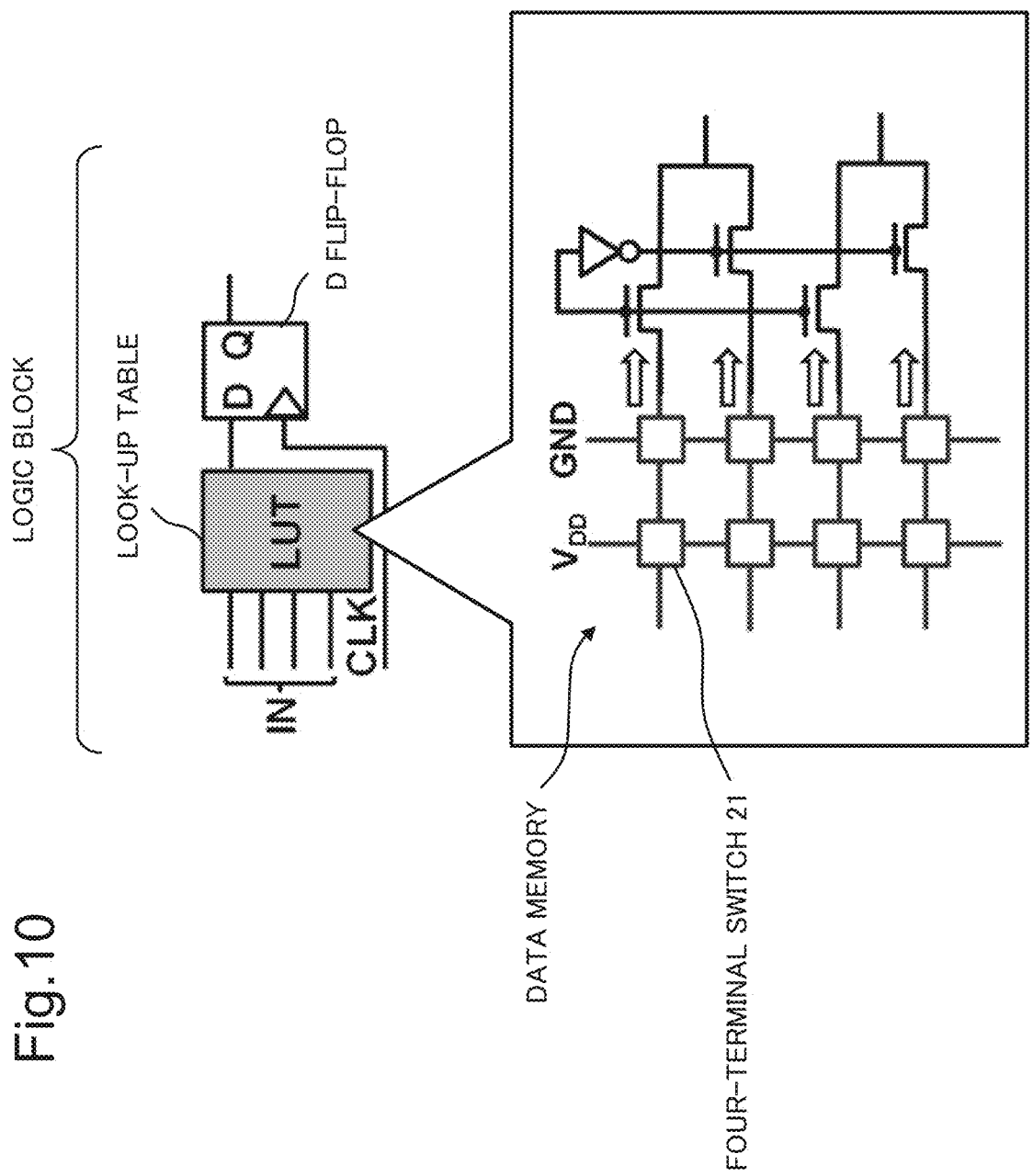
FIG. 10 is a diagram illustrating a configuration example of a logic block being a semiconductor integrated circuit using the switch circuit according to the second example embodiment of the present invention.

FIG. 10 is a diagram illustrating a configuration example of a logic block being a semiconductor integrated circuit using a switch circuit according to the present example embodiment. The logic block includes a look-up table and a D flip-flop, and the look-up table includes a data memory for storing a logic structure. By using a configuration of the switch circuit 2 including the four-terminal switch 21, the data memory can provide non-volatility and reduce power consumption.

Figure 11:
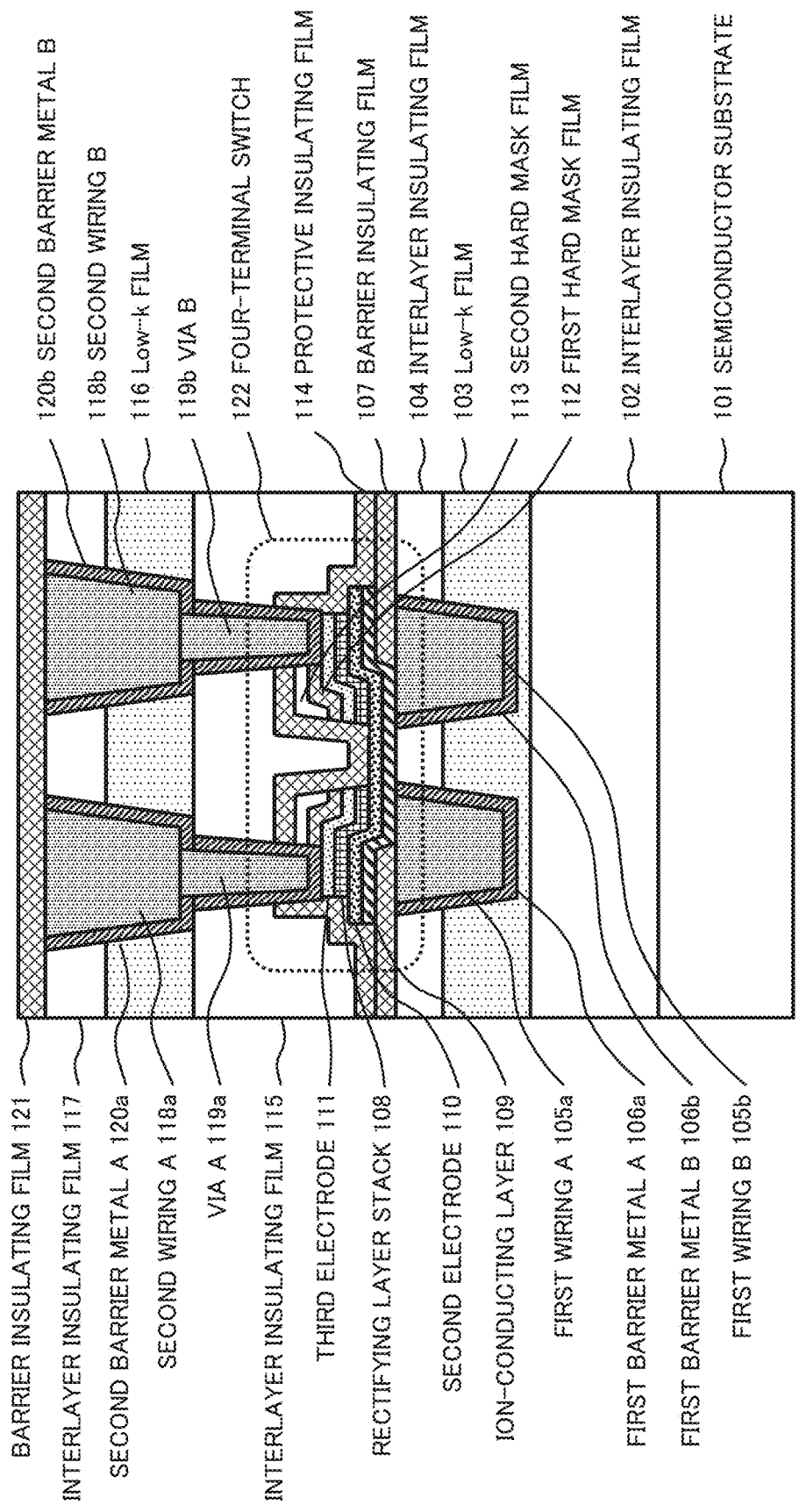
FIG. 11 is a cross-sectional view illustrating a specific configuration example when integrating the four-terminal switch in the switch circuit according to the second example embodiment of the present invention into a semiconductor integrated circuit.

FIG. 11 is a cross-sectional view illustrating a specific configuration example when a four-terminal switch constituting the switch circuit 2 according to the present example embodiment is integrated into a semiconductor integrated circuit; however, the configuration is not limited to the above.

A four-terminal switch 122 is formed inside a multilayer wiring layer on a semiconductor substrate 101. The multilayer wiring layer includes an insulating laminated body in which an interlayer insulating film 102, a low-k film 103, an interlayer insulating film 104, a barrier insulating film 107, a protective insulating film 114, an interlayer insulating film 115, a low-k film 116, an interlayer insulating film 117, and a barrier insulating film 121 are laminated on the semiconductor substrate 101 in this order. In the multilayer wiring layer, a first wiring A 105*a* and a first wiring B 105*b* are embedded in wiring trenches formed in the interlayer insulating film 104 and the low-k film 103 through a first barrier metal A 106*a* and a first barrier metal B 106*b*, respectively.

In the multilayer wiring layer, a second wiring A 118*a* and a second wiring B 118*b* are also embedded in wiring trenches formed in the interlayer insulating film 117 and the low-k film 116. Additionally, a via A 119*a* and a via B 119*b* are embedded in prepared holes formed in the interlayer insulating film 115, the protective insulating film 114, a second hard mask film 113, and a first hard mask film 112. The second wiring A 118*a* and the via A 119*a*, and the second wiring B 118*b* and the via B 119*b* are respectively integrated. Side surfaces and bottom surfaces of the second wiring A 118*a* and the via A 119*a*, and the second wiring B 118*b* and the via B 119*b* are respectively covered by a second barrier metal A 120*a* and a second barrier metal B 120*b*.

The multilayer wiring layer includes the first wiring A 105*a* and the first wiring B 105*b* to be active electrodes (each corresponding to the terminal 28*a* in the variable-resistance element 26 and hereinafter being referred to as a first electrode) of a variable-resistance element at an opening formed on the barrier insulating film 107 and the interlayer insulating film 104 sandwiched between the first wiring A 105*a* and the first wiring B 105*b*. Additionally, the multilayer wiring layer includes an ion-conducting layer 109 and a second electrode 110 (corresponding to the terminal 28*b* in the variable-resistance element 26) to be an inert electrode of the variable-resistance element at an opening of the barrier insulating film 107 and on a wall surface of the opening and the barrier insulating film 107. Each of a group of the first wiring A 105*a* (first electrode), the ion-conducting layer 109, and the second electrode 110, and a group of the first wiring B 105*b* (first electrode), the ion-conducting layer 109, and the second electrode 110 forms a variable-resistance element.

Furthermore, the multilayer wiring layer includes, on the second electrode 110 (corresponding to the terminal 28*b* in the rectifier element 27) also serving as one electrode of a rectifier element, a laminate in which a rectifying layer stack 108 and a third electrode 111 (corresponding to the terminal 28*c* in the rectifier element 27) being the other electrode of the rectifier element are laminated in this order. The second electrode 110, the rectifying layer stack 108, and the third electrode 111 form a rectifier element on each of the two variable-resistance elements. Additionally, the first hard mask film 112 and the second hard mask film 113 are formed on the third electrode 111. A top surface and a side surface of a laminated body of the ion-conducting layer 109, the second electrode 110, the rectifying layer stack 108, the third electrode 111, the first hard mask film 112, and the second hard mask film 113 are covered by the protective insulating film 114.

By making part of the first wiring A 105*a* and the first wiring B 105*b* active electrodes (first electrodes) of the variable-resistance elements, electrode resistance can be reduced while simplifying manufacturing processes. Specifically, by merely adding a process of using at least three photomasks to a known copper damascene wiring process, the four-terminal switch 122 including two switches in each of which a variable-resistance element and a rectifier element are connected in series can be formed in the multilayer wiring. Consequently, reduction of electrode resistance and cost reduction can be concurrently achieved.

In the four-terminal switch 122, the ion-conducting layer 109 is in direct contact with the first wiring A 105*a* and the first wiring B 105*b* at the opening formed on the barrier insulating film 107. At this time, metal constituting part of the ion-conducting layer 109 diffuses into the first wiring A 105*a* and the first wiring B 105*b*, and forms an alloy layer.

The four-terminal switch 122 includes the rectifying layer stack 108 on the second electrode 110, and the rectifying layer stack 108 is in contact with the third electrode 111 at the top surface. The third electrode 111 is electrically separated into two regions by etched. At this time, the rectifying layer stack 108 may be separated into two, similarly to the third electrode 111, or may not be separated. The first hard mask film 112 and the second hard mask film 113 separated similarly to the third electrode 111 exist on the third electrode 111. The second hard mask film 113 may disappear during the manufacturing process. In the four-terminal switch 122, the via A 119*a* and the via B 119*b* are electrically connected to the third electrode 111 on the third electrode 111 through the second barrier metal A 120*a* and the second barrier metal B 120*b*, respectively.

The four-terminal switch 122 performs on-off control by applying voltage or passing current between the second electrode 110, and the first wiring A 105*a* or the first wiring B 105*b* through the rectifying layer stack 108. For example, the four-terminal switch 122 performs on-off control by using electric field diffusion of a metal ion supplied from metal forming the first wiring A 105*a* and the first wiring B 105*b* into the ion-conducting layer 109. At this time, resistance in an on-state is determined by current in the rectifying layer stack 108.

The semiconductor substrate 101 is a substrate on which a semiconductor element is formed. For example, a substrate such as a silicon substrate, a single-crystal substrate, a silicon on insulator (SOI) substrate, a thin film transistor (TFT) substrate, or a substrate for manufacturing a liquid crystal may be used as the semiconductor substrate 101.

The interlayer insulating film 102 is an insulating film formed on the semiconductor substrate 101. For example, a silicon oxide film, or an SiOC film may be used as the interlayer insulating film 102. The interlayer insulating film 102 may be a laminate of a plurality of insulating films.

The low-k film 103 is an insulating film with a low dielectric constant and is arranged between the interlayer insulating films 102 and 104; and a low-dielectric-constant film (for example, an SiOCH film) with a relative dielectric constant lower than a silicon oxide film, or the like is used. Wiring trenches for embedding the first wiring A 105*a* and the first wiring B 105*b* are formed in the low-k film 103; and the first wiring A 105*a*, and the first wiring B 105*b* are embedded in the wiring trenches through the first barrier metal A 106*a* and the first barrier metal B 106*b*, respectively.

The interlayer insulating film 104 is an insulating film formed on the low-k film 103. For example, a silicon oxide film or an SiOC film may be used as the interlayer insulating film 104. The interlayer insulating film 104 may be a laminate of a plurality of insulating films. Wiring trenches for embedding the first wiring A 105*a* and the first wiring B 105*b* are formed in the interlayer insulating film 104; and the first wiring A 105*a* and the first wiring B 105*b* are embedded in the wiring trenches through the first barrier metal A 106*a* and the first barrier metal B 106*b*, respectively.

The first wiring A 105*a* and the first wiring B 105*b* are wirings embedded in the wiring trenches formed in the interlayer insulating film 104 and the low-k film 103 through the first barrier metal A 106*a* and the first barrier metal B 106*b*, respectively. The first wiring A 105*a* and the first wiring B 105*b* also serve as first electrodes (active electrodes) of the four-terminal switch 122 and are in direct contact with the ion-conducting layer 109. A top surface of the ion-conducting layer A109*a* is in direct contact with the second electrode 110 (inert electrode). A metal capable of diffusion and ionic conduction in the ion-conducting layer 109, such as copper, may be used as a metal constituting the first wiring A 105*a* and the first wiring B 105*b*; however, the metal is not limited to the above. For example, the metal constituting the first wiring A 105*a* and the first wiring B 105*b* may be an alloy of copper, and aluminum or the like.

The first barrier metal A 106*a* and the first barrier metal B 106*b* are conductive films having a barrier property and covering side surfaces and bottom surfaces of the wirings in order to prevent the metal forming the first wiring A 105*a* and the first wiring B 105*b* from diffusing into the interlayer insulating film 104 and a lower layer. For example, when the first wiring A 105*a* and the first wiring B 105*b* are composed of a metallic element with copper as a main component, a refractory metal or a nitride thereof, such as tantalum, tantalum nitride, titanium nitride, or tungsten carbonitride, or a laminated film thereof may be used as the first barrier metal A 106*a* the first barrier metal B 106*b*.

The barrier insulating film 107 is formed on the interlayer insulating film 104 including the first wiring A 105a and the first wiring B 105b. The barrier insulating film 107 prevents oxidation of the metal (for example, copper) forming the first wiring A 105a and the first wiring B 105b, and prevents diffusion of the metal forming the first wiring A 105a and the first wiring B 105b into the interlayer insulating film 115. Additionally, the barrier insulating film 107 has a role as an etching stopper layer when the third electrode 111, the rectifying layer stack 108, the second electrode 110, and the ion-conducting layer 109 are processed. For example, an SiC film, a silicon carbonitride film, a silicon nitride film, or a laminated structure thereof may be used as the barrier insulating film 107. It is preferable that the barrier insulating film 107 be of the same material as the protective insulating film 114 and the first hard mask film 112.

The ion-conducting layer 109 is a film resistance of which makes transitions between a high-resistance state and a low-resistance state. A material resistance of which changes by an action (such as diffusion, ionic conduction, or metal precipitation) of a metal ion generated from the metal forming the first wiring A 105a and the first wiring B 105b (active electrodes) may be used. When a resistance change to a low-resistance state (on) is performed by formation a metal bridge between the electrodes by reduction of metal ions, and a resistance change to a high-resistance state (off) is performed by disappearance of the metal bridge, an ion conductive film is used.

The ion-conducting layer 109 may have a laminated structure of a metallic-oxide-based ion-conducting layer in contact with the first wiring A 105a and the first wiring B 105b, and a polymer-based ion-conducting layer in contact with the second electrode 110.

The polymer-based ion-conducting layer may be formed by use of a plasma chemical vapor deposition (CVD) method. Raw materials of cyclic organosiloxane and helium being a carrier gas are introduced into a reaction chamber, and when supply of the two is stabilized and pressure in the reaction chamber becomes constant, application of RF power is started. For example, a supply amount of the raw materials may be set to 10 to 200 sccm and a supply amount of helium may be set to 500 sccm through a raw material vaporizer; however, the supply amounts are not limited to the above.

The metallic-oxide-based ion-conducting layer prevents the metal forming the first wiring A 105a and the first wiring B 105b from diffusing into the polymer-based ion-conducting layer due to heating and plasma during deposition of the polymer-based ion-conducting layer. Additionally, at this time, the metallic-oxide-based ion-conducting layer prevents oxidation of the first wiring A 105a and the first wiring B 105b and acceleration of diffusion thereof into the polymer-based ion-conducting layer. For example, a metal forming the metallic-oxide-based ion-conducting layer is zirconium, hafnium, aluminum, or titanium. The metal is exposed to an oxygen atmosphere at reduced pressure in a deposition chamber for the polymer-based ion-conducting layer after film formation of the metal, turns to zirconium oxide, hafnium oxide, aluminum oxide, or titanium oxide, and becomes part of the ion-conducting layer 109.

A preferable thickness of a metal film forming the metallic-oxide-based ion-conducting layer is 0.5 to 1 nm. The metal film may be a laminate or a single layer. It is preferable that formation of the metal film be performed by sputtering. A metal atom or an ion gaining energy by sputtering rushes and diffuses into the first wiring A 105a and the first wiring B 105b, and forms an alloy layer. The ion-conducting layer A 109 is formed on the first wiring A 105a, the first wiring B 105b, the interlayer insulating film 104 sandwiched between the first wiring A 105a and the first wiring B 105b, a tapered surface formed at the opening of the barrier insulating film 107, and the barrier insulating film 107.

The second electrode 110 is an inert electrode of the variable-resistance element in the four-terminal switch 122 and is in direct contact with the ion-conducting layer 109. An alloy of the following two types of metal may be used as the second electrode 110. One is ruthenium being a metal more resistant to ionization than the metal forming the first wiring A 105a and the first wiring B 105b and is resistant to diffusion and ionic conduction in the ion-conducting layer 109 and the ion-conducting layer B109b. The other is titanium, tantalum, zirconium, hafnium, aluminum, or the like having excellent adhesion with the metal forming the first wiring A 105a and the first wiring B 105b.

It is desirable that the metal alloyed with ruthenium be a metal having standard Gibbs energy of formation in a process (oxidation process) of generating a metal ion from the metal greater than ruthenium in a negative direction. Titanium, tantalum, zirconium, hafnium, and aluminum having standard Gibbs energy of formation greater than ruthenium in a negative direction are more likely to undergo a spontaneous chemical reaction compared with ruthenium and have high reactivity. Accordingly, adhesion between a metal bridge formed by the metal forming the first wiring A 105a and the first wiring B 105b, and the second electrode 110 is enhanced by alloying with ruthenium.

On the other hand, an added metal such as titanium, tantalum, zirconium, hafnium, or aluminum by itself without containing ruthenium has such high reactivity that a transition to an off-state does not occur. A transition from an on-state to an off-state progresses by an oxidation reaction (dissolution reaction) of the metal bridge. When standard Gibbs energy of formation of the metal constituting the second electrode 110 is greater than that of the metal forming the first wiring A 105a and the first wiring B 105b in a negative direction, an oxidation reaction of the metal constituting the second electrode 110 progresses ahead of the oxidation reaction of the metal bridge. Consequently, a transition to an off-state does not occur. Accordingly, the metal material used for the second electrode 110 needs to be alloyed with ruthenium having standard Gibbs energy of formation smaller than copper in a negative direction.

Furthermore, when copper being a component of the metal bridge is mixed into the metal constituting the second electrode 110, an effect of adding a metal having a large standard Gibbs energy in a negative direction is diminished, and therefore it is preferable that the metal added to ruthenium be a material having a barrier property with respect to copper and a copper ion. For example, tantalum or titanium may be used; and titanium particularly has excellent transition to an off-state and excellent stability in an on-state.

On the other hand, a greater amount of added metal stabilizes an on-state, and mere addition of about 5 at % enhances stability. It is preferable that the second electrode 110 be an alloy of ruthenium and titanium, and a content ratio of titanium be 20 to 30 at %. It is desirable that a content ratio of ruthenium in the ruthenium alloy be greater than or equal to 60 at % and less than or equal to 90 at %.

It is desirable to use a sputtering method for formation of a ruthenium alloy. When forming an alloy by use of the sputtering method, a method of using an alloy target of ruthenium and an added metal, and a co-sputtering method of simultaneously performing sputtering on a ruthenium target and an added metal target in the same chamber are available. Additionally, an intermixing method of previously forming a thin film of an added metal, performing film formation of ruthenium on the thin film by use of the sputtering method, and performing alloying by energy of colliding atoms is available. Use of the co-sputtering method and the intermixing method allows change in composition of an alloy. When employing the intermixing method, it is preferable to apply heat treatment at 400° C. or lower for leveling of a mixed state after film formation of ruthenium is completed.

Further, the second electrode 110 is an inert electrode of a variable-resistance element and is also one electrode of a rectifier element; therefore it is desirable that the second electrode 110 have a two-layer structure. The side of the second electrode 110 in contact with the ion-conducting layer 109 may be a ruthenium alloy, and the side in contact with the rectifying layer stack 108 may be a metallic nitride. A nitride of titanium or tantalum being stable in the atmosphere, being resistant to formation of an oxide film, and having a barrier property against oxygen and a copper ion is particularly preferable. Existence of an oxide film causes decrease in on-current of the rectifier element and a drop in dielectric breakdown voltage due to a defect in the oxide film.

Film formation of titanium nitride and tantalum nitride may be performed on an upper layer of a ruthenium alloy consistently in a vacuum by the sputtering method. When performing film formation of titanium nitride or tantalum nitride by use of the sputtering method, it is preferable to use a reactive sputtering method of vaporizing a metal target by use of plasma of a mixed gas of nitrogen and argon. Metal vaporized from a metal target reacts with nitrogen, turns to a metal nitride, and undergoes film formation on a substrate.

When film formation of titanium nitride or tantalum nitride is performed by the sputtering method, it is desirable that a ratio of an argon gas to a nitrogen gas be 50% or greater. In particular, in a case of titanium, by setting the ratio of an argon gas to a nitrogen gas to 50% or greater, a content ratio of nitrogen in titanium nitride can be made 50% or less. When a nitrogen content ratio in titanium nitride increases, specific resistance increases, and contact resistance between an electrode and amorphous silicon increases. In an electrode composed of nitrided metal, reduction of a nitrogen content ratio reduces contact resistance, increases on-state current of the rectifier element, and contributes to a suitable rectifying characteristic.

The rectifying layer stack 108 including a rectifying layer has a bipolar rectifying effect and has a characteristic that current nonlinearly increases with respect to applied voltage. The rectifying layer stack 108 provides excellent nonlinearity by laminating amorphous silicon being a buffer layer, silicon nitride being a rectifying layer, and amorphous silicon being a buffer layer in this order.

The buffer layer relaxes a band offset between titanium nitride or tantalum nitride being the rectifying layer, and the second and third electrode layers, and enhances electroconductivity in an on-state. Accordingly, with regard to the buffer layer, it is preferable that a work function of the buffer layer be greater than a work function of titanium nitride or tantalum nitride being the rectifying layer. Additionally, it is preferable that the work function of the buffer layer be smaller than work functions of the second and third electrodes.

The buffer layer may be composed of amorphous silicon. Amorphous silicon is deposited by a plasma CVD method using silane as a source gas. For example, 100 to 300 sccm of a silane gas is introduced into a parallel-plate plasma CVD reactor for a 300 mm wafer with substrate temperature being kept in a range of from 350 to 400° C., and an argon gas in a range of from 1 to 2 slpm and a helium gas in a range of from 1 to 2 slpm are also introduced. By additionally applying radio frequency (RF) power to a showerhead at 50 to 200 W with pressure at 300 to 600 Pa, an amorphous silicon film is deposited.

Dangling bonds having cleaved covalent bonds of silicon tend to be generated in amorphous silicon. Although part of dangling bonds are terminated by hydrogen in silane, an unterminated dangling bond may form a deep trap level. When a carrier is captured by the trap, part of on-current is limited. By introducing a hydrogen gas to a CVD reactor in addition to the aforementioned gas when film formation is performed, hydrogenation of amorphous silicon can be promoted. By introducing 100 sccm of a hydrogen gas or more, hydrogen termination of a dangling bond is promoted. Consequently, the deep trap level decreases and hopping conduction is facilitated, resulting in improved on-current.

The rectifying layer may be composed of silicon nitride. Silicon nitride is deposited by the plasma CVD method using silane and a nitrogen gas. For example, 30 sccm to 400 sccm of a silane gas and 1000 sccm of a nitrogen gas are introduced into a flat-plate plasma CVD reactor with substrate temperature kept in a range of from 350 to 400° C. By additionally applying RF power to a showerhead at 200 W with pressure at 600 Pa, a silicon nitride film is deposited.

The rectifying layer is a layer responsible for a rectifying characteristic of a rectifier element and exhibits an insulation property when low voltage is applied and electroconductivity when high voltage is applied. Electroconductivity appears due to a tunnel effect when high voltage is applied, and therefore it is desirable that a silicon nitride film in which a tunnel effect is generated be a thin film. However, an excessively thin film increases leak current, and therefore it is desirable that specific resistance of the silicon nitride film be high. Accordingly, it is desirable that the silicon nitride film be a film having a high nitrogen content ratio and a content ratio close to stoichiometry.

Further, when a band offset between the rectifying layer and the buffer layer is large, the rectifying layer limits part of on-current when high voltage is applied. Accordingly, it is desirable to arrange, between a silicon nitride film in which a tunnel effect is generated and the buffer layer, a separate silicon nitride film with a band gap smaller than that of the silicon nitride film in which a tunnel effect is generated. Adjustment of the band gap may be performed by reducing a content ratio of nitrogen in the silicon nitride film.

Specifically, a gas flow rate of silane introduced to a CVD reactor is set to about 30 sccm to 50 sccm at film formation of a silicon nitride film in which a tunnel effect is generated, and a gas flow rate of silane is set to about 300 sccm to 400 sccm at film formation of a silicon nitride film with a small band gap. At this time, it is assumed that a flow rate of a nitrogen gas is 1000 sccm. Consequently, a nitrogen content ratio of the silicon nitride film in which a tunnel effect is generated may become 50% or greater, and a nitrogen content ratio of the silicon nitride film for adjusting the band gap may become 50% or less. Film formation of the rectifying layer and the buffer layer may be continuously performed in the CVD reactor without atmospheric exposure.

The third electrode 111 is metal to be the other electrode of the rectifier element and is composed of a metallic nitride. A nitride of titanium or tantalum being stable in the atmosphere, being resistant to formation of an oxide film, and having a barrier property against oxygen and a copper ion is particularly preferable. Existence of an oxide film causes decrease in on-current of the rectifier element and a drop in dielectric breakdown voltage due to a defect in the oxide film.

Film formation of titanium nitride or tantalum nitride is performed consistently in a vacuum by the sputtering method. When performing nitriding, nitrogen is introduced into a chamber, and film formation of a nitride is performed by the reactive sputtering method. When performing film formation of titanium nitride and tantalum nitride by use of the sputtering method, it is preferable to use the reactive sputtering method of vaporizing a metal target by use of plasma of a mixed gas of nitrogen and argon. Metal vaporized from the metal target reacts with nitrogen, turns to a metal nitride, and is deposited on a substrate.

When film formation of titanium nitride or tantalum nitride is performed by the sputtering method, it is desirable that a ratio of an argon gas to a nitrogen gas be 50% or greater. In particular, in a case of titanium, by setting the ratio of an argon gas to a nitrogen gas to 50% or greater, a content ratio of nitrogen in titanium nitride can be made 50% or less. When a nitrogen content ratio in titanium nitride increases, specific resistance increases, and contact resistance between an electrode and amorphous silicon increases. In an electrode composed of nitrided metal, reduction of a nitrogen content ratio reduces contact resistance, increases on-state current of the rectifier element, and contributes to a suitable rectifying characteristic.

The first hard mask film 112 is a film to be a hard mask film and also a passivation film when etching the third electrode 111, the second electrode 110, the rectifying layer stack 108, and the ion-conducting layer 109. For example, a silicon nitride film or a silicon oxide film, or a laminate thereof may be used as the first hard mask film 112. It is preferable that the first hard mask film 112 contains the same material as the protective insulating film 114 and the barrier insulating film 107.

The second hard mask film 113 is a film to be a hard mask film when etching the third electrode 111, the second electrode 110, the rectifying layer stack 108, and the ion-conducting layer 109. For example, a silicon nitride film or a silicon oxide film, or a laminate thereof may be used as the second hard mask film 113.

In order to form the four-terminal switch 122, film formation of the ion-conducting layer 109, the second electrode 110, the rectifying layer stack 108, the third electrode 111, the first hard mask film 112, and the second hard mask film 113 is performed on the barrier insulating film 107. Subsequently, in such a manner as to transfer the second hard mask film 113 shape formed through two sets of patterning and etching onto the four-terminal switch 122 part, two rectifier elements are separated in one etching process and are formed on the second electrode 110. In the first of the two sets of patterning, part of the thickness of the second hard mask film 113 is processed, leaving a resist in a region where the rectifying layer stack 108 is to be kept. Specifically, about 60% is processed. Subsequently, in the second set of patterning, the remaining thickness of the second hard mask film 113 is processed, leaving a resist in a region where the four-terminal switch 122 is formed, including the region where the rectifying layer stack 108 is to be kept.

The protective insulating film 114 is an insulating film having a function of further preventing separation of oxygen from the ion-conducting layer 109 without damaging the four-terminal switch 122. For example, a silicon nitride film or a silicon carbonitride film may be used as the protective insulating film 114. It is preferable that the protective insulating film 114 be of the same material as the first hard mask film 112 and the barrier insulating film 107. When the same material is used, the protective insulating film 114 is integrated with the barrier insulating film 107 and the first hard mask film 112, resulting in enhancement of interface adhesion, and the four-terminal switch 122 can be more firmly protected.

The interlayer insulating film 115 is an insulating film formed on the protective insulating film 114. For example, a silicon oxide film and an SiOC film may be used as the interlayer insulating film 115. The interlayer insulating film 115 may be a laminate of a plurality of insulating films. The interlayer insulating film 115 may be of the same material as the interlayer insulating film 117. Prepared holes for embedding the via A 119a and the via B 119b are formed in the interlayer insulating film 115; and the via A 119a and the via B 119b are embedded in the prepared holes through the second barrier metal A 120a and the second barrier metal B 120b, respectively.

The low-k film 116 is an insulating film with a low dielectric constant and is arranged between the interlayer insulating films 115 and 117; and a low-dielectric-constant film (for example, an SiOCH film) having a relative dielectric constant lower than that of a silicon oxide film may be used. Wiring trenches for embedding the second wiring A 118a and the second wiring B 118b are formed in the low-k film 116; and the second wiring A 118a and the second wiring B 118b are embedded in the wiring trenches through the second barrier metal A 120a and the second barrier metal B 120b, respectively.

The interlayer insulating film 117 is an insulating film formed on the low-k film 116. For example, a low-dielectric-constant film (for example, an SiOCH film) having a relative dielectric constant lower than that of a silicon oxide film, an SiOC film, and a silicon oxide film may be used as the interlayer insulating film 117. The interlayer insulating film 117 may be a laminate of a plurality of insulating films. The interlayer insulating film 117 may be of the same material as the interlayer insulating film 115. Wiring trenches for embedding the second wiring A 118a and the second wiring B 118b are formed in the interlayer insulating film 117; and the second wiring A 118a and the second wiring B 118b are embedded in the wiring trenches through the second barrier metal A 120a and the second barrier metal B 120b, respectively.

The second wiring A 118a and the second wiring B 118b are wirings embedded in the wiring trenches formed in the interlayer insulating film 117 and the low-k film 116, through the second barrier metal A 120a and the second barrier metal B 120b, respectively. The second wiring A 118a and the second wiring B 118b are integrated with the via A 119a and the via B 119b, respectively. The via A 119a and the via B 119b are embedded in prepared holes formed in the interlayer insulating film 115, the protective insulating film 114, the first hard mask film 112, and the second hard mask film 113, through the second barrier metal A 120a and the second barrier metal B 120b, respectively. The via A 119a and the via B 119b are electrically connected to the third electrode 111 through the second barrier metal A 120a and the second barrier metal B 120b, respectively. For example, copper may be used as the second wiring A 118a and the second wiring B 118b, and the via A 119a and the via B 119b.

The second barrier metal A 120a and the second barrier metal B 120b prevent the metal forming the second wiring A 118a and the second wiring B 118b (including the via A 119a and the via B 119b) from diffusing into the interlayer insulating films 115 and 117, and a lower layer. For this purpose, conductive films having a barrier property and covering the side surfaces and the bottom surfaces of the second wiring A 118a and the second wiring B 118b, and the via A 119a and the via B 119b may be used as the second barrier metal A 120a and the second barrier metal B 120b. For example, when the second wiring A 118a and the second wiring B 118b, and the via A 119a and the via B 119b are metal with copper as a main component, a refractory metal or a nitride thereof, such as tantalum, tantalum nitride, titanium nitride, or tungsten carbonitride, or a laminated film thereof may be used.

The barrier insulating film 121 is an insulating film formed on the interlayer insulating film 117 including the second wiring A 118a and the second wiring B 118b. The barrier insulating film 121 has a role of preventing oxidation of the metal (for example, copper) forming the second wiring A 118a and the second wiring B 118b and preventing diffusion of the metal forming the second wiring A 118a and the second wiring B 118b into an upper layer. For example, a silicon carbonitride film, a silicon nitride film, or a laminated structure thereof may be used as the barrier insulating film 121.

The four-terminal switch 122 illustrated in FIG. 11 formed inside the multilayer wiring layer, as described above, can provide the current-voltage characteristic of the variable-resistance element in FIG. 4A, the current-voltage characteristic of the rectifier element in FIG. 4B, and the current-voltage characteristic of the series connection of the variable-resistance element and the rectifier element in FIG. 4D.

With a switch circuit including four-terminal switches with the configuration illustrated in FIG. 11 and being a crossbar switch including 20 rows and 50 columns of input lines and output lines, an amount of current flowing through the switch circuit in an on-operation has been compared between the switching method according to the present example embodiment and a known switching method (comparative example). The switch circuit in this case does not include a peripheral circuit such as a buffer, and each signal line (each input line and each output line) and each control line is directly connected to a current measuring pad in such a way that current flowing through each wiring in an on-operation can be measured.

In an on-operation according to the present example embodiment, in a plurality of variable-resistance elements in a plurality of four-terminal switches connected to an input line, a group of variable-resistance elements connected to the input line were first turned on, and then a group of variable-resistance elements connected to output lines were turned on. Further, in a known on-operation being a comparative example, a variable-resistance element connected to an input line in a four-terminal switch was turned on, then a variable-resistance element connected to an output line was turned on, and then similar on-operations were repeated in the next and subsequent four-terminal switches. When performing an on-operation, 3 V being a sufficient voltage for making a transition of a variable-resistance element from a high-resistance state to a low-resistance state was applied.

Figure 12:
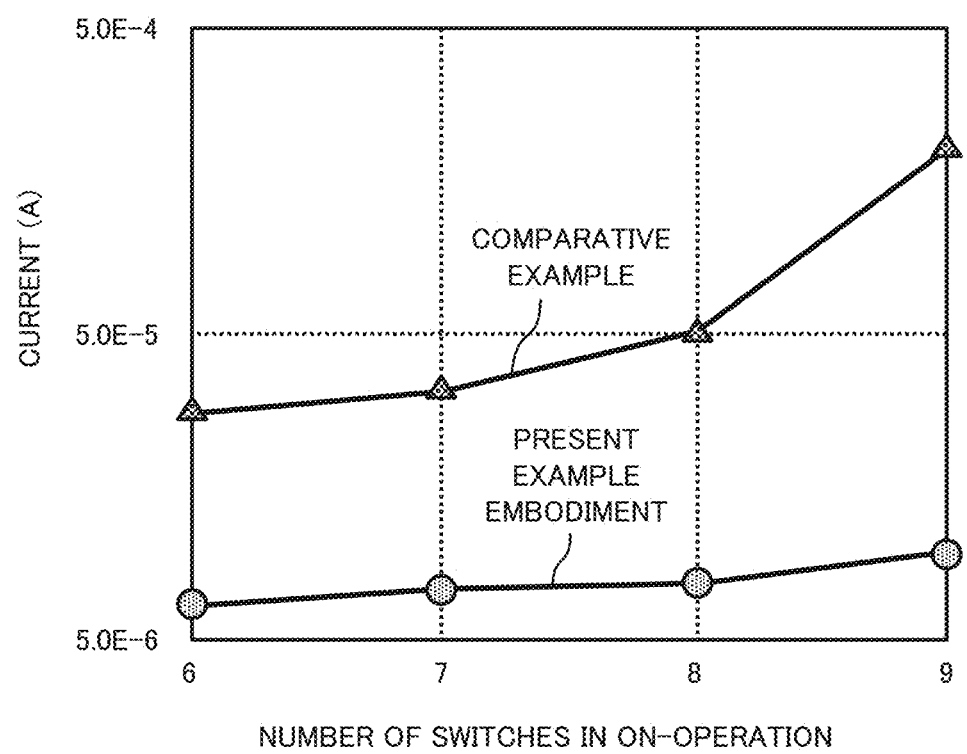
FIG. 12 is a diagram comparing current in an on-operation between a switching method according to the second example embodiment of the present invention and an existing switching method.

FIG. 12 is a diagram for comparing on-operation current between the switching method according to the present example embodiment and the known switching method (comparative example). The vertical axis and the horizontal axis represent a current value measured when an on-operation is performed and a number of four-terminal switches in the on-operation, respectively. In the switching method according to the present example embodiment, on-operation current was small and the current value did not particularly increase even when the number of switches increased; and a normal on-operation was possible with the number of switches being 9. On the other hand, in the switching method in the comparative example, on-operation current was large, and the current remarkably increased with increase in the number of switches; and an on-operation was not possible with the number of switches being 9.

There is parasitic resistance greater than or equal to 100 fF on each wiring in the switch circuit. Accordingly, it is understood that the result illustrated in FIG. 12 was acquired in the case of an on-operation in the switching method in the comparative example by current for charging or discharging a wiring flowing through a four-terminal switch being already turned on. As described above, it is confirmed that the switching method according to the present example embodiment can suppress unnecessary current when a switch operation is performed.

FIG. 13A to FIG. 13M are cross-sectional views for illustrating a process when integrating a four-terminal switch in a switch circuit according to the present example embodiment into a semiconductor integrated circuit. While a specific example of a process of forming a four-terminal switch inside a multilayer wiring layer will be described below by use of FIG. 13A to FIG. 13M, the process is not limited to the example.

Figure 13A:
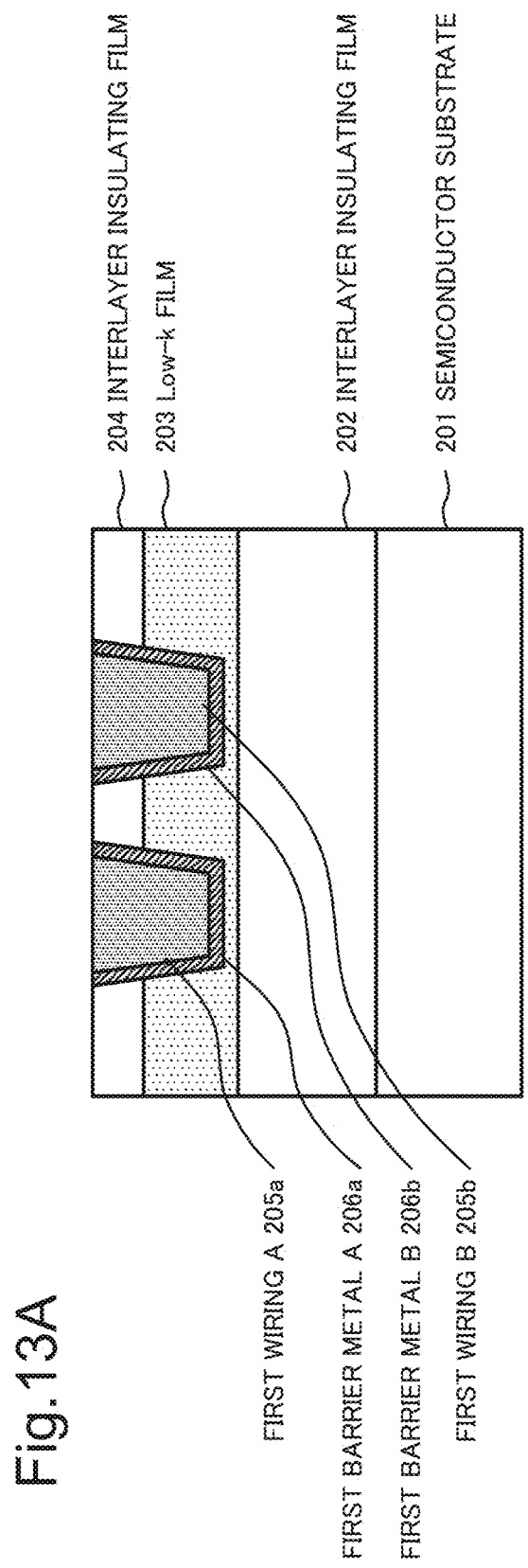
FIG. 13A is a cross-sectional view for illustrating a process when integrating the four-terminal switch in the switch circuit according to the second example embodiment of the present invention into a semiconductor integrated circuit.

Process 1: FIG. 13A

An interlayer insulating film 202 (for example, a silicon oxide film with a film thickness of 500 nm) is deposited on a semiconductor substrate 201 (for example, a substrate on which a semiconductor element is formed). Further, a low-dielectric-constant film with a low relative dielectric constant (for example, an SiOCH film with a film thickness of 150 nm) is deposited as a low-k film 203. Further, a silicon oxide film (for example, a silicon oxide film with a film thickness of 100 nm) is deposited as an interlayer insulating film 204. Further, wiring trenches are formed in the interlayer insulating film 204 and the low-k film 203 by use of a photolithography method (including photoresist formation, dry etching, and photoresist removal). Further, a first wiring A 205a and a first wiring B 205b (for example, copper) are embedded in the wiring trenches through a first barrier metal A 206a and a first barrier metal B 206b (for example, tantalum nitride/tantalum with film thicknesses of 5 nm/5 nm), respectively.

The interlayer insulating films 202 and 204 may be formed by the plasma CVD method. For example, in the formation of the first wiring A 205a and the first wiring B 205b, the first barrier metal A 206a and the first barrier metal B 206b (for example, laminated films of tantalum nitride/tantalum) are first formed by a physical vapor deposition (PVD) method. Next, after copper seeds are formed by the PVD method, copper is buried in the wiring trenches by an electrolytic plating method. Then, the interlayer insulating films 202 and 204 may be formed by removing excess copper not existing in the wiring trenches by a chemical mechanical polishing (CMP) method after heat treatment at a temperature greater than or equal to 150° C.

Common techniques in the relevant technical fields may be used in such a series of copper wiring formation methods. The CMP method is a method of planarizing unevenness of a wafer surface generated during a multilayer wiring formation process by bringing the unevenness into contact with a rotating polishing pad and polishing the unevenness, while flowing a polishing solution on the wafer surface. Planarization can be performed by forming an embedded wiring (damascene wiring) by polishing excess copper embedded in a trench, and polishing an interlayer insulating film.

Figure 13B:
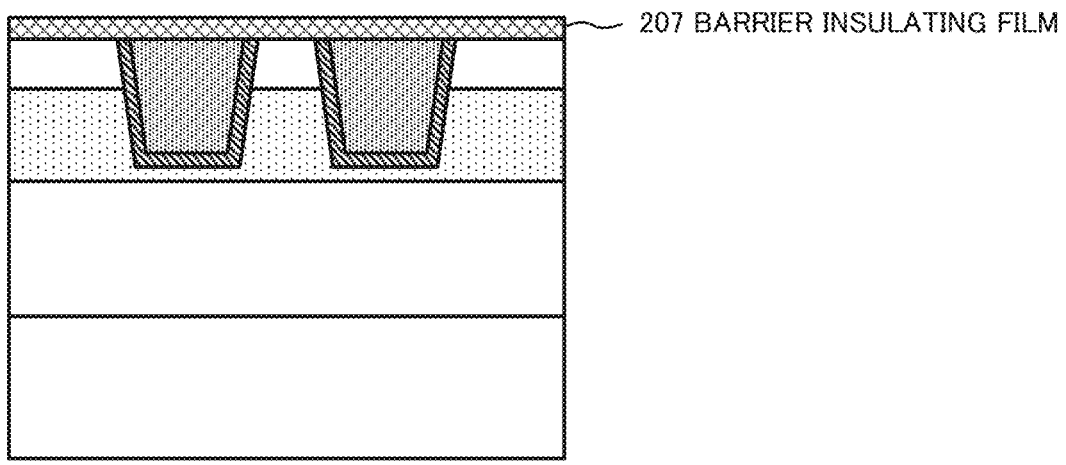
FIG. 13B is a cross-sectional view for illustrating the process when integrating the four-terminal switch in the switch circuit according to the second example embodiment of the present invention into a semiconductor integrated circuit.

Process 2: FIG. 13B

A barrier insulating film 207 (for example, a silicon nitride film or a silicon carbonitride film with a film thickness of 30 nm) is formed on the interlayer insulating film 204 including the first wiring A 205a and the first wiring B 205b. The barrier insulating film 207 may be formed by the plasma CVD method. It is preferable that a thickness of the barrier insulating film 207 be about 10 nm to 50 nm.

Figure 13C:
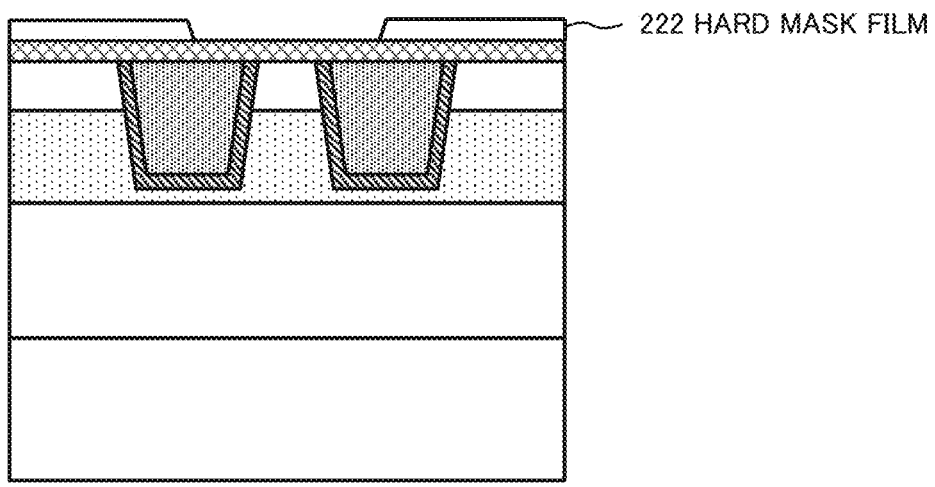
FIG. 13C is a cross-sectional view for illustrating the process when integrating the four-terminal switch in the switch circuit according to the second example embodiment of the present invention into a semiconductor integrated circuit.

Process 3: FIG. 13C

A hard mask film 222 (for example, a silicon oxide film with a film thickness of 40 nm) is formed on the barrier insulating film 207. At this time, it is preferable that the hard mask film 222 be of a material different from that of the barrier insulating film 207 from the viewpoint of keeping an etching selection ratio high in dry etching processing; and the hard mask film 222 may be an insulating film or a conductive film. For example, a silicon oxide film, a silicon nitride film, titanium nitride, titanium, tantalum, or tantalum nitride may be used as the hard mask film 222, and a laminated film of a silicon nitride/silicon oxide film may also be used.

An opening is formed on the hard mask film 222 by forming a photoresist mask (unillustrated) including an opening on the hard mask film 222 and performing dry etching by use of the photoresist mask. Subsequently, the photoresist mask is removed by oxygen plasma ashing or the like. At this time, the dry etching does not necessarily need to stop at a top surface of the barrier insulating film 207 and may reach inside the barrier insulating film 207.

Figure 13D:
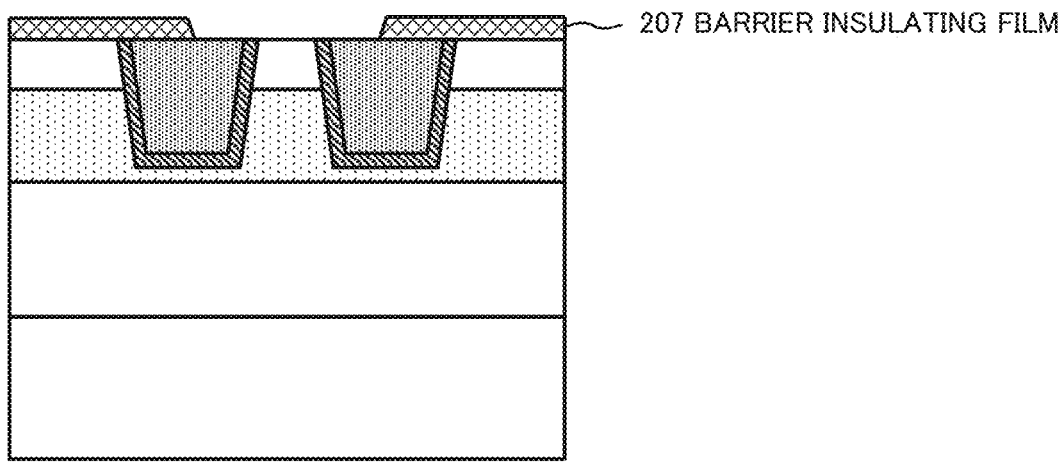
FIG. 13D is a cross-sectional view for illustrating the process when integrating the four-terminal switch in the switch circuit according to the second example embodiment of the present invention into a semiconductor integrated circuit.

Process 4: FIG. 13D

An opening is formed on the barrier insulating film 207 by etching back (dry etching) the barrier insulating film 207 exposed from the opening of the hard mask film 222 with the hard mask film 222 as a mask. Consequently, the first wiring A 205a and the first wiring B 205b are exposed from the opening of the barrier insulating film 207. Subsequently, by being exposed to plasma using a mixed gas of nitrogen and argon, copper oxide formed on the exposed surface of the first wiring A 205a and the first wiring B 205b is removed and also an etching by-product generated upon the etch back, and the like are removed.

In the etch back of the barrier insulating film 207, a wall surface of the opening of the barrier insulating film 207 may be made a tapered surface by using reactive dry etching. In reactive dry etching, a gas containing fluorocarbon may be used as an etching gas. While it is preferable that the hard mask film 222 be completely removed during the etch back, the hard mask film 222 may remain intact when the hard mask film 222 is of an insulating material. Further, for example, a shape of the opening of the barrier insulating film 207 in plane view may be circular, and a diameter of the circle may range from 30 nm to 500 nm.

Figure 13E:
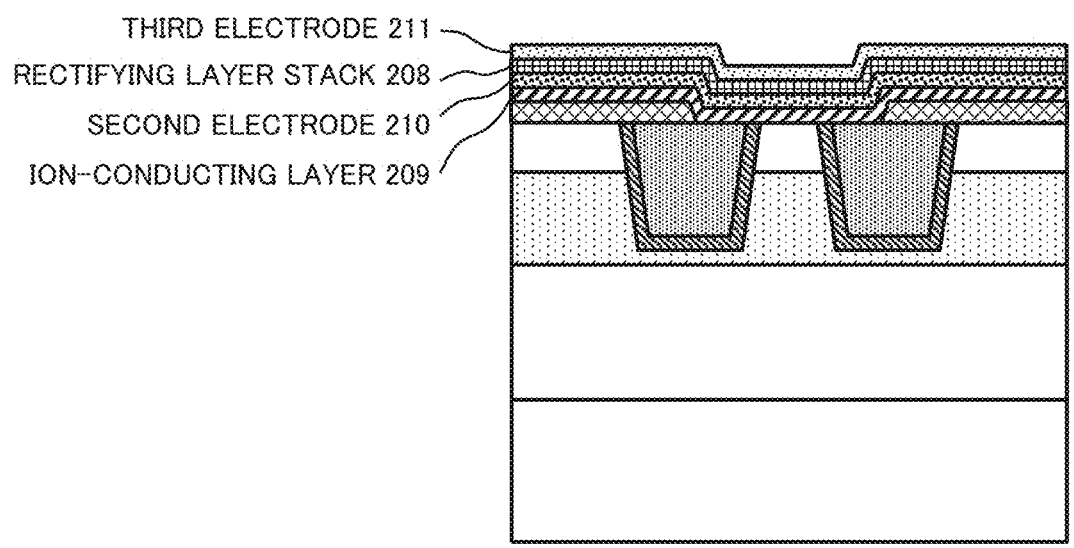
FIG. 13E is a cross-sectional view for illustrating the process when integrating the four-terminal switch in the switch circuit according to the second example embodiment of the present invention into a semiconductor integrated circuit.

Process 5: FIG. 13E

An ion-conducting layer 209 is formed on the barrier insulating film 207 including the first wiring A 205a and the first wiring B 205b. First, 1 nm of zirconium is deposited by the sputtering method. Zirconium is oxidized when a polymer ion-conducting layer film is formed and forms part of the ion-conducting layer 209. At this time, zirconium diffuses into a part in contact with the ion-conducting layer 209 in the first wiring A 205a and the first wiring B 205b, and an alloy layer is spontaneously formed. Additionally, by performing annealing in a vacuum environment at a temperature of 350° C., a thickness of the alloy layer can be increased. It is preferable to perform the annealing for about two minutes.

Furthermore, an SiOCH-based polymer film containing silicon, oxygen, carbon, and hydrogen is formed by the plasma CVD as the polymer ion-conducting layer. Raw materials of cyclic organosiloxane and helium being a carrier gas are introduced into a reaction chamber, and when supply of the two is stabilized and pressure in the reaction chamber becomes constant, application of RF power is started. A supply amount of the raw material is set to 10 to 200 sccm, supply of helium is set to 500 sccm through a raw material vaporizer, and 500 sccm of helium is directly supplied to the reaction chamber through a separate line. Moisture and the like are adhered to the opening of the barrier insulating film 507 due to atmospheric exposure, and therefore it is preferable to perform degassing by applying heat treatment at reduced pressure at a temperature about 250° C. to 350° C. before deposition of the polymer ion-conducting layer.

An alloy of ruthenium and titanium with a film thickness of 10 nm is formed on the ion-conducting layer 209 as a lower layer of a second electrode 210 by the co-sputtering method. At this time, a ruthenium target and a titanium target are set in the same chamber, and an alloy film is deposited by simultaneous sputtering. At this time, a content ratio of ruthenium in the alloy of ruthenium and titanium is made 75 at % by setting power applied to the ruthenium target to 150 W and power applied to the titanium target to 50 W. The ruthenium alloy becomes an inert electrode of the variable-resistance element.

Further, titanium nitride with a film thickness of 5 nm to 10 nm is formed on the ruthenium alloy as an upper layer of the second electrode 210 by the reactive sputtering method. At this time, power applied to a titanium target is set to 500 W to 1 kW, and a nitrogen gas and an argon gas are introduced into a chamber and undergo sputtering. At this time, a content ratio of titanium in titanium nitride is made 50 at % or higher by setting a ratio of a flow rate of nitrogen to a flow rate of argon to 2:1.

Film formation of amorphous silicon, silicon nitride, and amorphous silicon are performed in this order on the second electrode 210 as a rectifying layer stack 208 by the plasma CVD with substrate temperature being kept in a range of from 350 to 400° C. It is desirable that a film thickness of each is 5 nm or less. For example, film formation of 2 nm of amorphous silicon and 1 nm of silicon nitride is performed. The film formation is continuously performed by switching an introduced gas in a state of plasma being ignited.

Amorphous silicon is deposited by introducing a silane gas in a range of from 100 to 300 sccm, introducing an argon gas in a range of from 1 to 2 slpm and a helium gas in a range of from 1 to 2 slpm, and applying RF power to a showerhead at 50 to 200 W with pressure at 300 to 600 Pa. Hydrogenation of amorphous silicon can be promoted by introducing a hydrogen gas into the CVD reactor in addition to the aforementioned gas when the film formation is performed.

In formation of silicon nitride, a silicon nitride film can be deposited by introducing 200 sccm of a silane gas and 1000 sccm of a nitrogen gas, and applying RF power to the showerhead at 200 W with pressure at 600 Pa.

The silicon nitride film is responsible for a rectifying characteristic of a rectifier element and has an insulation property when low voltage is applied and electroconductivity when high voltage is applied. When high voltage is applied, electroconductivity appears due to a tunnel effect, and therefore it is desirable that the silicon nitride film in which a tunnel effect is generated be a thin film. However, an excessively thin film increases leak current, and therefore it is desirable that specific resistance of the silicon nitride film be high. Accordingly, it is desirable that the silicon nitride film be a film having a high nitrogen content ratio and a content ratio close to stoichiometry.

Further, a large band offset between a rectifying layer and a buffer layer limits part of on-current when high voltage is applied. Accordingly, it is desirable to arrange, between a silicon nitride film in which a tunnel effect is generated being a rectifying layer and the buffer layer, a silicon nitride film a band gap of which is smaller than that of the silicon nitride film in which a tunnel effect is generated. Adjustment of the band gap is performed by reducing a content ratio of nitrogen in the silicon nitride film. Specifically, when a silicon nitride film in which a tunnel effect is generated is formed, a gas flow rate of silane introduced into a CVD reactor is set to about 30 sccm, and when a silicon nitride film with a small band gap is formed, a gas flow rate of silane is set to about 200 sccm to 400 sccm. The film formation of the rectifying layer and the buffer layer is continuously performed in the CVD reactor without atmospheric exposure. For example, the rectifying layer stack 208 may be a laminate of 0.25 nm of silicon nitride with a small band gap, 0.5 nm of silicon nitride in which a tunnel effect is generated, and 0.25 nm of silicon nitride with a small band gap.

Titanium nitride with a film thickness of 15 nm to 25 nm is formed on the rectifying layer stack 208 as a third electrode 211 by the reactive sputtering method. At this time, power applied to a titanium target is set to 500 W to 1 kW, and a nitrogen gas and an argon gas are introduced into a chamber and undergo sputtering. At this time, a content ratio of titanium in titanium nitride is made 50 at % or higher by setting a ratio of a flow rate of nitrogen to a flow rate of argon to 2:1.

Figure 13F:
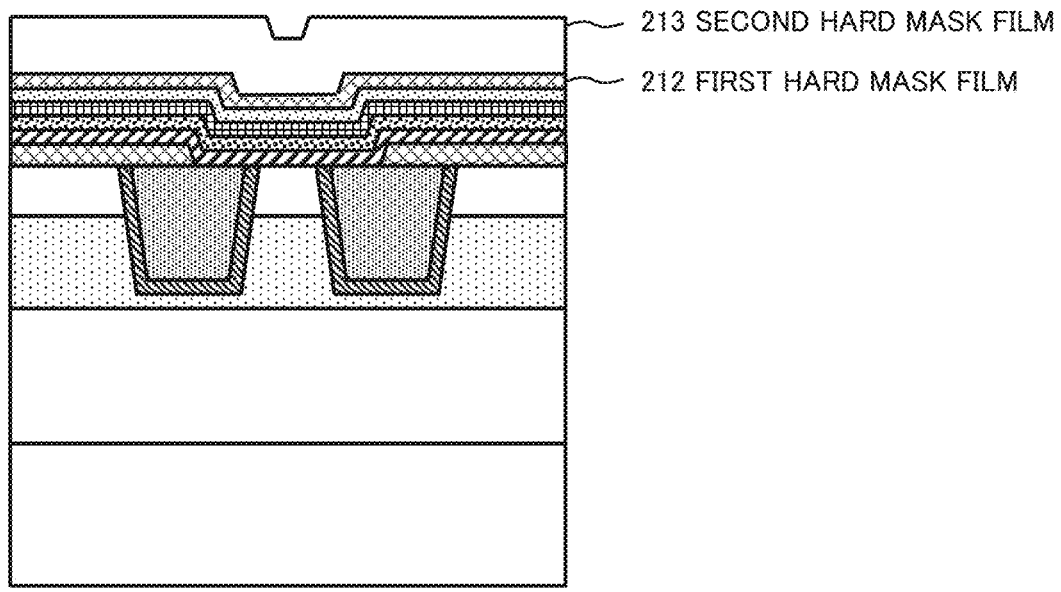
FIG. 13F is a cross-sectional view for illustrating the process when integrating the four-terminal switch in the switch circuit according to the second example embodiment of the present invention into a semiconductor integrated circuit.

Process 6: FIG. 13F

A first hard mask film 212 (for example, a silicon nitride film or a silicon carbonitride film with a film thickness of 30 nm) and a second hard mask film 213 (for example, a silicon oxide film with a film thickness of 100 nm) are laminated on the third electrode 211 in this order. The first hard mask film 212 and the second hard mask film 213 may be formed by use of the plasma CVD method. The first hard mask film 212 and the second hard mask film 213 may be formed by use of a common plasma CVD method in the relevant technical field.

Further, it is preferable that the first hard mask film 212 and the second hard mask film 213 be different film types; and for example, the first hard mask film 212 may be a silicon nitride film, and the second hard mask film 213 may be a silicon oxide film. At this time, it is preferable that the first hard mask film 212 be of the same material as a protective insulating film 214, to be described later, and the barrier insulating film 207. Further, it is preferable to use a high-density silicon nitride film or the like that may be formed by the plasma CVD method in high-density plasma of a mixed gas of $SiH_4/N_2$ as the first hard mask film 212.

Figure 13G:
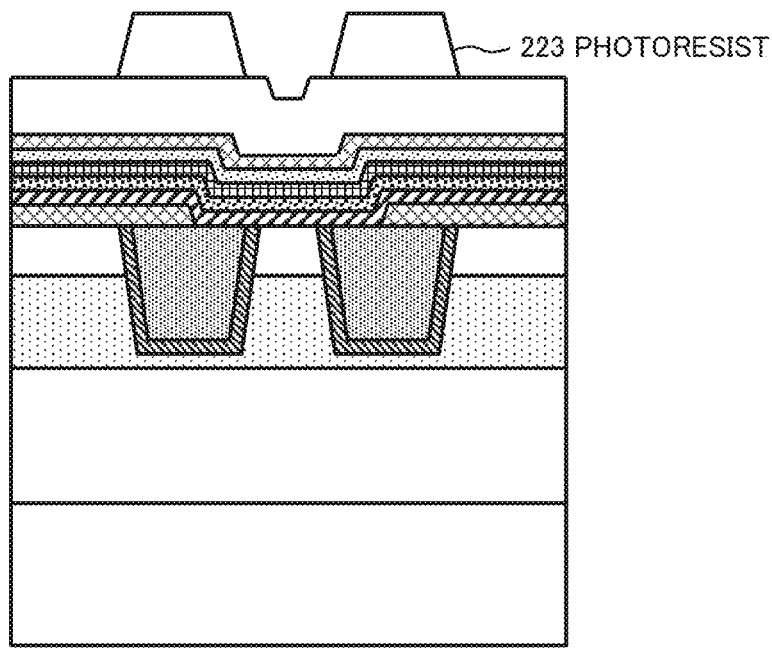
FIG. 13G is a cross-sectional view for illustrating the process when integrating the four-terminal switch in the switch circuit according to the second example embodiment of the present invention into a semiconductor integrated circuit.

Process 7: FIG. 13G

A photoresist 223 for patterning a rectifier element part of the four-terminal switch is formed on the second hard mask film 213 by the photolithography method.

Figure 13H:
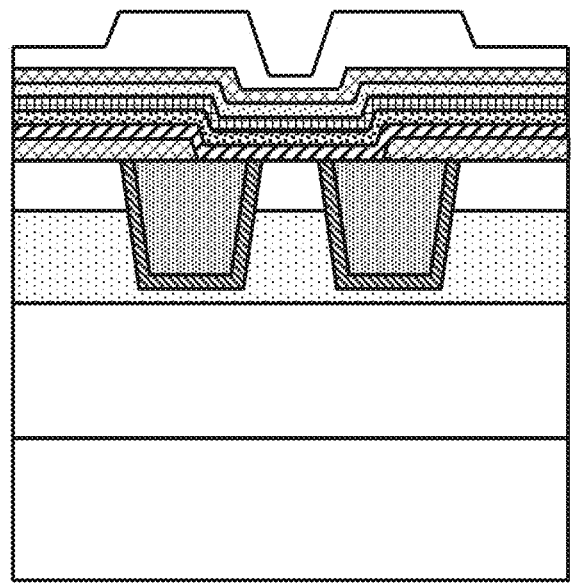
FIG. 13H is a cross-sectional view for illustrating the process when integrating the four-terminal switch in the switch circuit according to the second example embodiment of the present invention into a semiconductor integrated circuit.

Process 8: FIG. 13H

Part of the second hard mask film 213 is dry etched with the photoresist 223 as a mask, and then the photoresist is removed by use of oxygen plasma ashing and organic stripping. A thickness of a part where the photoresist 223 is not formed is decreased by etching, and a thickness of a part where the photoresist 223 is formed is not decreased. It is desirable that an etching film thickness be about 30 nm to 70 nm. Specifically, it is desirable that an etching film thickness be 60 nm, a remaining thickness of the second hard mask film 213 in the part where the photoresist 223 is formed be 100 nm, and a remaining thickness of the second hard mask film 213 in the part where the photoresist 225 is not formed be about 40 nm.

Figure 13I:
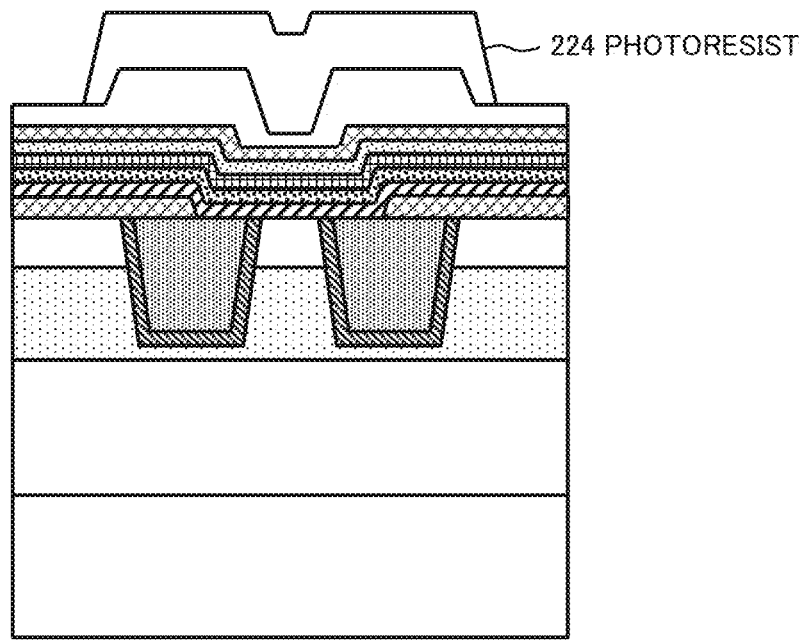
FIG. 13I is a cross-sectional view for illustrating the process when integrating the four-terminal switch in the switch circuit according to the second example embodiment of the present invention into a semiconductor integrated circuit.

Process 9: FIG. 13I

A photoresist 224 for patterning a four-terminal switch element part is formed on the processed second hard mask film 213 by the photolithography method.

Figure 13J:
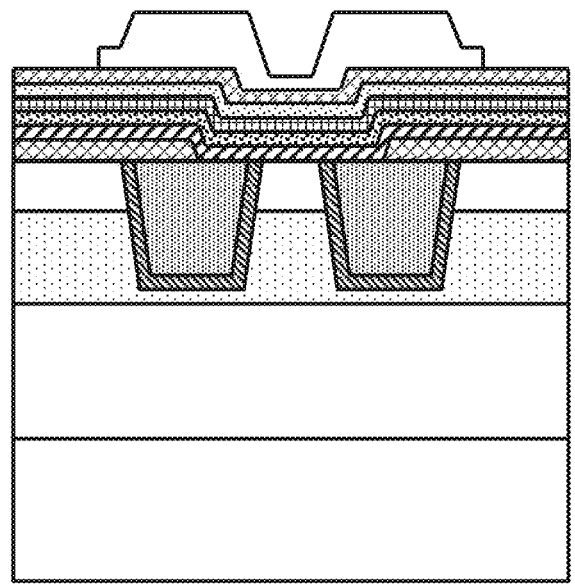
FIG. 13J is a cross-sectional view for illustrating the process when integrating the four-terminal switch in the switch circuit according to the second example embodiment of the present invention into a semiconductor integrated circuit.

Process 10: FIG. 13J

Dry etching is performed on the remaining second hard mask film 213 with the photoresist 224 as a mask, and then the photoresist is removed by use of oxygen plasma ashing and organic stripping. After the dry etching, the first hard mask film 212 is exposed in a part where neither the photoresist 223 nor the photoresist 224 is formed. The second hard mask film 213 is processed by two-stage dry etching, and a remaining film thickness of a part of the rectifier element part of the four-terminal switch is 100 nm, a remaining film thickness of a part other than the rectifier element forming part of the four-terminal switch is 40 nm, and a remaining film thickness of the remaining part is 0 nm. While it is desirable that the first hard mask film 212 is not dry etched in the part where the first hard mask film 212 is exposed, a few nanometers may be etched.

Figure 13K:
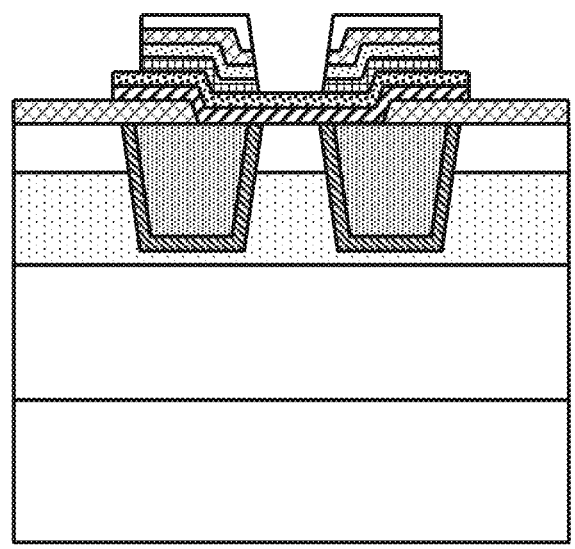
FIG. 13K is a cross-sectional view for illustrating the process when integrating the four-terminal switch in the switch circuit according to the second example embodiment of the present invention into a semiconductor integrated circuit.

Process 11: FIG. 13K

The first hard mask film 212, the third electrode 211, the rectifying layer stack 208, the second electrode 210, and the ion-conducting layer 209 are continuously dry etched with the second hard mask film 213 as a mask, in such a manner as to transfer a shape of the processed second hard mask film 213 onto a lower layer. Consequently, the four-terminal switch is formed. In the four-terminal switch forming part, the second hard mask film 213, the first hard mask film 212, and the third electrode 211 remain only in the rectifier element forming part. The second hard mask film 213 may be removed.

The second hard mask film 213, the first hard mask film 212, and the third electrode 211 are etched and removed in the part where the rectifier element is not formed in the four-terminal switch forming part. The part where the photoresist 223 and the photoresist 224 are not formed in Process 7 and Process 9, respectively, is removed by etching down to the second electrode 210 and the ion-conducting layer 209. A few nanometers of the barrier insulating film 207 may be etched after the dry etching.

For example, when upper layers of the third electrode 211 and second electrode 210 are titanium nitride, processing by $Cl_2$-based RIE may be performed, and when a lower layer of the second electrode 210 is an alloy of ruthenium and titanium, RIE processing with a mixed gas of $Cl_2/O_2$ may be performed. The rectifying layer stack 208 may be processed along with the third electrode 211 and the second electrode 210 by the same $Cl_2$-based RIE as the third electrode 211 and the second electrode 210.

Further, in the etching of the ion-conducting layer 209, dry etching needs to be stopped on the barrier insulating film 207 being a lower surface. For example, it is assumed that the ion-conducting layer 209 is an SiOCH-based polymer film containing silicon, oxygen, carbon, and hydrogen, and the barrier insulating film 207 is a silicon nitride film or a silicon carbonitride film. In this case, RIE processing may be performed by adjusting an etching condition with a mixed gas such as a $CF_4$-based, $CF_4/Cl_2$-based, or $CF_4/Cl_2/Ar$-based mixed gas.

By using the hard mask RIE method as described above, the variable-resistance element part may be processed without exposing the variable-resistance element part to oxygen plasma ashing for resist removal. Further, when oxidation treatment is performed by oxygen plasma after the processing, the oxidation plasma treatment may be irradiated without depending on a resist stripping time.

Figure 13L:
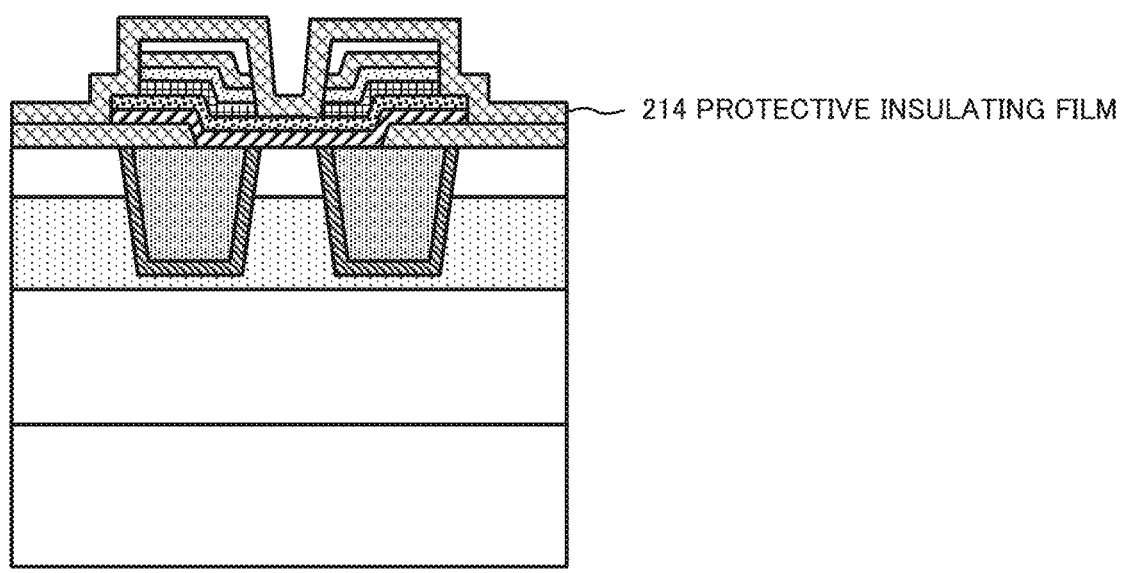
FIG. 13L is a cross-sectional view for illustrating the process when integrating the four-terminal switch in the switch circuit according to the second example embodiment of the present invention into a semiconductor integrated circuit.

Process 12: FIG. 13L

The protective insulating film 214 (for example, 20 nm of a silicon nitride film or a silicon carbonitride film) is deposited on the first hard mask film 212, the second hard mask film 213, the third electrode 211, the rectifying layer stack 208, the second electrode 210, and the barrier insulating film 207 including the ion-conducting layer 209. While the protective insulating film 214 may be formed by the plasma CVD method, the protective insulating film 214 needs to be maintained at reduced pressure in a reaction chamber before film formation, and there is a problem at this time that oxygen separates from a side surface of the ion-conducting layer 209 and leak current of the ion-conducting layer increases. In order to suppress the problem, it is preferable to set film-forming temperature of the protective insulating film 214 to 400° C. or lower. Additionally, since the protective insulating film 214 is exposed to a film-forming gas at reduced pressure before film formation, it is preferable not to use a reducing gas. For example, it is preferable to use a silicon nitride film formed at a substrate temperature of 400° C. with high-density plasma of a mixed gas of $SiH_4/N_2$.

Process 13: FIG. 13M

An interlayer insulating film 215 (for example, a silicon oxide film), a low-dielectric-constant film (for example, an SiOCH film with a film thickness of 150 nm) having a low relative dielectric constant as a low-k film 216, and an interlayer insulating film 217 (for example, a silicon oxide film) are deposited on the protective insulating film 214 in this order. Additionally, wiring trenches for a second wiring A 218a and a second wiring B 218b, and prepared holes for a via A 219a and a via B 219b are formed. Additionally, by use of a copper dual damascene wiring process, the second wiring A 218a and the second wiring B 218b (for example, copper), and the via A 219a and the via B 219b (for example, copper) are simultaneously formed in the wiring trenches and the prepared holes through a second barrier metal A 220a and a second barrier metal B 220b (for example, tantalum nitride/tantalum), respectively. Subsequently, a barrier insulating film 221 (for example, a silicon nitride film) is deposited on the interlayer insulating film 217 including the via A 219a and the via B 219b.

A process similar to the formation of the lower layer wiring may be used for the formation of the via A 219a and the via B 219b. The interlayer insulating film 215, the low-k film 216, and the interlayer insulating film 217 may be formed by the plasma CVD method. In order to clear a level difference formed by the four-terminal switch, the interlayer insulating film 215 may be thickly deposited, and planarized by CMP, in such a way as to have a desired thickness.

The prepared holes for the via A 219a and the via B 219b are formed by simultaneous etching with a simultaneously patterned photomask. The first hard mask film 212 and the second hard mask film 213 are etched and removed when the via A 219a and the via B 219b are formed. Consequently, the via A 219a and the via B 219b are directly connected to the third electrode 211. Etching of the via A 219a and the via B 219b may be stopped at the third electrode 211 by using a fluorocarbon-based etching gas having a slow etching rate with respect to a titanium nitride ruthenium alloy.

By the processes described above, the four-terminal switch can be formed inside the multilayer wiring layer.

As described above, the switch circuit 2 according to the present example embodiment can eliminate a separate switch in an on-state on an input line or an output line connected to a switch in a switch operation, when switching a plurality of switches supporting multi-fan-out. Alternatively, unnecessary current caused by a separate switch in an on-state can be suppressed. Consequently, delay in a switch operation time due to an effect of parasitic capacitance, and leak current are suppressed. Consequently, a high-speed switch operation with short pulses can be performed with high reliability.

As described above, the present example embodiment can provide a switch circuit capable of a high-speed and highly reliable switch operation in a crossbar switch using a variable-resistance element supporting multi-fan-out.

The present invention is not limited to the aforementioned example embodiments and may be modified in various ways within the scope of the invention described in the claims, and it goes without saying that such modifications are also included in the scope of the present invention.

A part or the whole of the aforementioned example embodiments may also be described as follows but are not limited to the following configurations.

Supplementary Note 1

A switch circuit including:

a plurality of four-terminal switches in each of which two switches each including a variable-resistance element and a rectifier element being connected in series, each of the variable-resistance element and the rectifier element including two terminals, are connected at the terminals on the series connections;

an input line and an output line each connected to the terminal of the variable-resistance element in the two switches, the terminal being separate from the terminal on the series connection, a number of at least one of the input line and the output line being more than one; and a control line each connected to the terminal of the rectifier element in the two switches, the terminal being separate from the terminal on the series connection, wherein, out of the variable-resistance elements in a plurality of the four-terminal switches out of the four-terminal switches connected to one of the input line and the output line, the control line turns on or off, with the input line and the output line, a group of the variable-resistance elements connected to the input line and a group of the variable-resistance elements connected to the output line, sequentially for each group.

Supplementary Note 2

The switch circuit according to supplementary note 1, wherein, out of the variable-resistance elements in a plurality of the four-terminal switches out of the four-terminal switches connected to one of the input line and the output line, the control line first turns on a group of the variable-resistance elements connected to the one of the input line and the output line.

Supplementary Note 3

The switch circuit according to supplementary note 1 or 2, wherein, out of the variable-resistance elements in a plurality of the four-terminal switches out of the four-terminal switches connected to one of the input line and the output line, the control line first turns off a group of the variable-resistance elements separate from the variable-resistance elements connected to the one of the input line and the output line.

Supplementary Note 4

The switch circuit according to any one of supplementary notes 1 to 3, wherein the control line turns on or off a group of the variable-resistance elements connected to the input line and a group of the variable-resistance elements connected to the output line, simultaneously for each group.

Supplementary Note 5

The switch circuit according to any one of supplementary notes 1 to 4, wherein the four-terminal switch allows signal transmission on the input line and the output line by turning on both of the two variable-resistance elements included in the four-terminal switch.

Supplementary Note 6

The switch circuit according to any one of supplementary notes 1 to 5, wherein the variable-resistance element includes a variable-resistance layer using a metal bridge.

Supplementary Note 7

The switch circuit according to any one of supplementary notes 1 to 6, wherein the rectifier element includes a bipolar rectifying layer.

Supplementary Note 8

The switch circuit according to supplementary note 7, wherein the rectifying layer contains amorphous silicon and silicon nitride.

Supplementary Note 9

A semiconductor device including a semiconductor integrated circuit including the switch circuit according to any one of supplementary notes 1 to 8.

Supplementary note 10

The semiconductor device according to supplementary note 9, wherein the semiconductor integrated circuit includes a wiring layer, and the switch circuit is provided in the wiring layer.

Supplementary Note 11

A switching method of a switch circuit including:

a plurality of four-terminal switches in each of which two switches each including a variable-resistance element and a rectifier element being connected in series, each of the variable-resistance element and the rectifier element including two terminals, are connected at the terminals on the series connections;

an input line and an output line each connected to the terminal of the variable-resistance element in the two switches, the terminal being separate from the terminal on the series connection, a number of at least one of the input line and the output line being more than one; and a control line each connected to the terminal of the rectifier element in the two switches, the terminal being separate from the terminal on the series connection, the switching method including, out of the variable-resistance elements in a plurality of the four-terminal switches out of the four-terminal switches connected to one of the input line and the output line, turning on or off a group of the variable-resistance elements connected to the input line and a group of the variable-resistance elements connected to the output line, sequentially for each group.

Supplementary Note 12

The switching method according to supplementary note 11, further including, out of the variable-resistance elements in a plurality of the four-terminal switches out of the four-terminal switches connected to one of the input line and the output line, first turning on a group of the variable-resistance elements connected to the one of the input line and the output line.

Supplementary Note 13

The switching method according to supplementary note 11 or 12, further including, out of the variable-resistance elements in a plurality of the four-terminal switches out of the four-terminal switches connected to one of the input line and the output line, first turning off a group of the variable-resistance elements separate from the variable-resistance elements connected to the one of the input line and the output line.

Supplementary Note 14

The switching method according to any one of supplementary notes 11 to 13, further including turning on or off a group of the variable-resistance elements connected to the input line and a group of the variable-resistance elements connected to the output line, simultaneously for each group.

Supplementary Note 15

The switching method according to any one of supplementary notes 11 to 14, further including allowing signal transmission on the input line and the output line by turning on both of the two variable-resistance elements included in the four-terminal switch.

Supplementary Note 16

The switching method according to any one of supplementary notes 11 to 15, wherein the variable-resistance element includes a variable-resistance layer using a metal bridge.

Supplementary Note 17

The switching method according to any one of supplementary notes 11 to 16, wherein the rectifier element includes a bipolar rectifying layer.

Supplementary Note 18

The switching method according to supplementary note 17, wherein the rectifying layer contains amorphous silicon and silicon nitride.

This application is based upon and claims the benefit of priority from Japanese Patent Application No. 2017-078050, filed on Apr. 11, 2017, the disclosure of which is incorporated herein in its entirety by reference.

REFERENCE SIGNS LIST 1, 2, 2' Switch circuit
11, 21 Four-terminal switch
12, 22 Switch
13, 23 Input line
14, 24 Output line
15, 25 Control line
16, 26 Variable-resistance element
17, 27 Rectifier element
18a, 18b, 18c, 28a, 28b, 28c Terminal
20, 20' Semiconductor integrated circuit
200 Semiconductor device
3 Driver circuit
4 Input line voltage application circuit
5 Output line voltage application circuit
6 Control line voltage application circuit
7 Control circuit
101, 201 Semiconductor substrate
102, 202 Interlayer insulating film
103, 203 Low-k film
104, 204 Interlayer insulating film
105a, 205a First wiring A
105b, 205b First wiring B
106a, 206a First barrier metal A 106*b*, 206*b* First barrier metal B
107, 207 Barrier insulating film
108, 208 Rectifying layer stack
109, 209 Ion-conducting layer
110, 210 Second electrode
111, 211 Third electrode
112, 212 First hard mask film
113, 213 Second hard mask film
114, 214 Protective insulating film
115, 215 Interlayer insulating film
116, 216 Low-k film
117, 217 Interlayer insulating film
118*a*, 218*a* Second wiring A
118*b*, 218*b* Second wiring B
119*a*, 219*a* Via A
119*b*, 219*b* Via B
120*a*, 220*a* Second barrier metal A
120*b*, 220*b* Second barrier metal B
121, 221 Barrier insulating film
222 Hard mask film
223, 224 Photoresist

What is claimed is:

1. A switch circuit comprising:
a plurality of four-terminal switches in each of which two switches each including a variable-resistance element and a rectifier element being connected in series, each of the variable-resistance element and the rectifier element including two terminals, are connected at the terminals on the series connections;
an input line and an output line each connected to the terminal of the variable-resistance element in the two switches, the terminal being separate from the terminal on the series connection, a number of at least one of the input line and the output line being more than one; and
a control line each connected to the terminal of the rectifier element in the two switches, the terminal being separate from the terminal on the series connection, wherein,
out of the variable-resistance elements in a plurality of the four-terminal switches out of the four-terminal switches connected to one of the input line and the output line, the control line turns on or off, with the input line and the output line, a group of the variable-resistance elements connected to the input line and a group of the variable-resistance elements connected to the output line, sequentially for each group.

2. The switch circuit according to claim 1, wherein, out of the variable-resistance elements in a plurality of the four-terminal switches out of the four-terminal switches connected to one of the input line and the output line, the control line first turns on a group of the variable-resistance elements connected to the one of the input line and the output line.

3. The switch circuit according to claim 1, wherein, out of the variable-resistance elements in a plurality of the four-terminal switches out of the four-terminal switches connected to one of the input line and the output line, the control line first turns off a group of the variable-resistance elements separate from the variable-resistance elements connected to the one of the input line and the output line.

4. The switch circuit according to claim 1, wherein the control line turns on or off a group of the variable-resistance elements connected to the input line and a group of the variable-resistance elements connected to the output line, simultaneously for each group.

5. The switch circuit according to claim 1, wherein the four-terminal switch allows signal transmission on the input line and the output line by turning on both of the two variable-resistance elements included in the four-terminal switch.

6. The switch circuit according to claim 1, wherein the variable-resistance element includes a variable-resistance layer using a metal bridge.

7. The switch circuit according to claim 1, wherein the rectifier element includes a bipolar rectifying layer.

8. The switch circuit according to claim 7, wherein the rectifying layer contains amorphous silicon and silicon nitride.

9. A semiconductor device comprising a semiconductor integrated circuit including the switch circuit according to claim 1.

10. The semiconductor device according to claim 9, wherein
the semiconductor integrated circuit includes a wiring layer, and
the switch circuit is provided in the wiring layer.

11. A switching method of a switch circuit including:
a plurality of four-terminal switches in each of which two switches each including a variable-resistance element and a rectifier element being connected in series, each of the variable-resistance element and the rectifier element including two terminals, are connected at the terminals on the series connections;
an input line and an output line each connected to the terminal of the variable-resistance element in the two switches, the terminal being separate from the terminal on the series connection, a number of at least one of the input line and the output line being more than one; and
a control line each connected to the terminal of the rectifier element in the two switches, the terminal being separate from the terminal on the series connection, the switching method comprising,
out of the variable-resistance elements in a plurality of the four-terminal switches out of the four-terminal switches connected to one of the input line and the output line, turning on or off a group of the variable-resistance elements connected to the input line and a group of the variable-resistance elements connected to the output line, sequentially for each group.

12. The switching method according to claim 11, further comprising,
out of the variable-resistance elements in a plurality of the four-terminal switches out of the four-terminal switches connected to one of the input line and the output line, first turning on a group of the variable-resistance elements connected to the one of the input line and the output line.

13. The switching method according to claim 11, further comprising,
out of the variable-resistance elements in a plurality of the four-terminal switches out of the four-terminal switches connected to one of the input line and the output line, first turning off a group of the variable-resistance elements separate from the variable-resistance elements connected to the one of the input line and the output line.

14. The switching method according to claim 11, further comprising
turning on or off a group of the variable-resistance elements connected to the input line and a group of the variable-resistance elements connected to the output line, simultaneously for each group.

15. The switching method according to claim 11, further comprising allowing signal transmission on the input line and the output line by turning on both of the two variable-resistance elements included in the four-terminal switch.

16. The switching method according to claim 11, wherein the variable-resistance element includes a variable-resistance layer using a metal bridge.

17. The switching method according to claim 11, wherein the rectifier element includes a bipolar rectifying layer.

18. The switching method according to claim 17, wherein the rectifying layer contains amorphous silicon and silicon nitride.

* * * * *